US009285681B2

(12) United States Patent
Hsieh

(10) Patent No.: US 9,285,681 B2
(45) Date of Patent: Mar. 15, 2016

(54) PHOTOSENSITIVE RESIN COMPOSITION AND USES THEREOF

(71) Applicant: CHI MEI CORPORATION, Tainan (TW)

(72) Inventor: Li-Ting Hsieh, Tainan (TW)

(73) Assignee: CHI MEI CORPORATION, Tainan (TW)

(*) Notice: Subject to any disclaimer, the term of this patent is extended or adjusted under 35 U.S.C. 154(b) by 0 days.

(21) Appl. No.: 14/281,715

(22) Filed: May 19, 2014

(65) Prior Publication Data
US 2014/0356786 A1    Dec. 4, 2014

(30) Foreign Application Priority Data

May 31, 2013   (TW) .............................. 102119257 A

(51) Int. Cl.
*G03F 7/038*   (2006.01)
*G02F 1/1335*   (2006.01)

(52) U.S. Cl.
CPC ............ *G03F 7/0388* (2013.01); *G02F 1/1335* (2013.01); *G03F 7/0385* (2013.01)

(58) Field of Classification Search
None
See application file for complete search history.

(56) References Cited

U.S. PATENT DOCUMENTS

| 5,965,328 | A  | * | 10/1999 | Sano et al. | 430/315 |
| 6,620,510 | B1 | * | 9/2003 | Taguchi | C08J 5/24 |
| | | | | | 428/297.4 |
| 2005/0214660 | A1 | * | 9/2005 | Yamada | 430/7 |
| 2007/0154820 | A1 | * | 7/2007 | Kang et al. | 430/7 |
| 2011/0117333 | A1 | * | 5/2011 | Furukawa | 428/195.1 |
| 2012/0196949 | A1 | * | 8/2012 | Heo et al. | 522/63 |
| 2014/0154627 | A1 | * | 6/2014 | Tanabe | 430/280.1 |
| 2014/0231729 | A1 | * | 8/2014 | Shiota et al. | 252/586 |

FOREIGN PATENT DOCUMENTS

| JP | 2004-240241 A | 8/2004 |
| JP | 2010-054561 A | 3/2010 |
| TW | 201005019 | 2/2010 |
| TW | 201305733 | 2/2013 |
| WO | WO-2009/133843 A1 | * 11/2009 |
| WO | WO 2012/176694 A1 | * 12/2012 |
| WO | WO 2013/012035 A1 | * 1/2013 |

OTHER PUBLICATIONS

"Aliphatic compounds" IUPAC Compendium of Chemical Terminology one page from PAC, 1995, 67, 1307 (GLossary of class names of organic compounds and reactivity intermediates base on structure (IUPAC Recommendations 1995)) onpage 1313, obtained online from IUPAC gold book.*
CAS Registry No. 215806-04-5, one page obtained from SciFinder database on Mar. 31, 2015 idenying O 1382 as a trade name of this compound, American Chemical Society copyright.*
English translation of WO 2009133843 A1 published Nov. 5, 2009, Translation from ProQuest Dialog online done Mar. 30, 2015, 75 pages.*
SciFinder database entry for WO2009133843 and the list of substances identified therewith down loaged Apr. 1, 2013, 10 pages.*
Derwent-ACC-No: 2009-R51511, English abstract of WO 2009133843 A1 publication dated Nov. 5, 2009 ( in same family as TW 201005019 A cited by applicants), Derwent Week: 201265, 6 pages down loaded Apr. 1, 2015.*
CAS Registry No. : 126-00-1 , "diphenolic acid" from SciFinder database down loaded Apr. 1, 2015, one page.*
CAS Registry No. 31256-79-8 , "ESF 300" in Other Names, downloaded from SciFinder database on Sep. 14, 2015, American Chemical Society, 2 pages.*
Office action and Search report issued on Oct. 21, 2014 for the corresponding Taiwan Patent Application No. 102119257, translation of search report.
Translation of the Search report issued on Oct. 21, 2014 for the corresponding Taiwan Patent Application No. 102119257.
Translation of TW 201005019, one page abstract only submitted Dec. 26, 2014.
Translation of TW 201305733, one page abstract only submitted Dec. 26, 2014.

* cited by examiner

*Primary Examiner* — Cynthia Hamilton
(74) *Attorney, Agent, or Firm* — WPAT, P.C.; Anthony King

(57) ABSTRACT

The invention relates to a photosensitive resin composition, and an overcoat and/or spacer for a liquid crystal display component. The photosensitive resin composition comprises an alkali-soluble resin (A), a compound having an ethylenically unsaturated group (B); a photoinitiator (C); a solvent (D); and an organic acid (E). The alkali-soluble resin (A) comprises a resin having an unsaturated group (A-1) synthesized by polymerizing a mixture, and the mixture comprises an epoxy compound having at least two epoxy groups (i) and a compound having at least one carboxyl group and at least one vinyl unsaturated group (ii). A molecular weight of said organic acid (E) is below 1000.

12 Claims, No Drawings

PHOTOSENSITIVE RESIN COMPOSITION AND USES THEREOF

BACKGROUND OF THE INVENTION

1. Field of the Invention

The invention relates to a photosensitive resin composition, an overcoat or a spacer formed by the composition and a liquid crystal display component. Particularly, the invention provides n overcoat or a spacer formed by the composition and a liquid crystal display component having good resolution and good developability manufactured with the photosensitive resin composition.

2. Description of the Related Art

Generally, color printed pixels and black matrix on a color filter produce an uneven surface. An overcoat is usually formed on the surface of the color filter to hide the uneven surface and to meet the requirement of flatness.

Demanding procedures under harsh conditions are required for manufacturing a liquid crystal display component or a solid-state imaging device, etc. For example, local high temperature occurs when processing by infusion with an acid solvent or alkaline solvent on the surface of substrate or by sputtering to form a wiring electrode layer. Thus, an overcoat is needed to be laid on these components to prevent them from damage. To enable the overcoat to resist the aforementioned processing, an excellent adhesive force between the overcoat and substrate is required, along with a surface of high transparency, high hardness and smoothness; furthermore, high heat resistance and light resistance could prevent the overcoat from deteriorations including: discoloration, yellowing or whitening, etc. Moreover, good water-proofing and strong resistance to chemicals, solvents, acid and alkali, etc, of the overcoat is also required.

On the other hand, to maintain an interlayer spacing (intercellular space) between two substrates in conventional colored liquid crystal display components, polystyrene beads or silica beads are randomly sprayed on the entire substrate, of which the diameter of the beads is the spacing between two substrates. However, uneven positioning and density distribution of the beads causes scattering of the backlight and further reducing the contrast of the display components. Therefore, a photosensitive composition for the spacer developed by photolithography becomes the mainstream in this field. The spacer is formed by coating the photosensitive composition for a spacer on the substrate, and placing a designated-shaped photomask between the substrate and the exposure source; then by development after exposure, a spacer is formed on a designated position outside the effective pixel to solve the problems in the prior art. The intercellular space is also controlled by the cell thickness formed by the photosensitive composition, enabling to control its spacing with high accuracy.

Nowadays, the overcoat and spacer are generally made of photosensitive resin by means of coating, exposure and developing, etc.

As the overcoat or spacer is formed on a colored filter or substrate, an extremely high transparency is required. When the overcoat or spacer with poor transparency is applied to a liquid crystal display component, inadequate luminance of the liquid crystal display component is caused, thus affecting its display quality.

To improve the transparency of the overcoat or spacer, Japanese Patent Publication No. 2010-054561 disclosed a photosensitive composition for an overcoat, comprising: an alkali-soluble bonding resin (A); an ethylenically unsaturated compound (B); a light initiator (C); and a solvent (D); wherein the bonding equivalent of the unsaturated bond in the ethylenically unsaturated compound (B) is between 90 and 450 g/eq, and the amount of unsaturated double bond of a single compound is between 2 and 4 in the ethylenically unsaturated compound (B); and the average molecular weight of the alkali-soluble bonding resin (A) is between 10,000 and 20,000. Additionally, Japanese Patent Publication No. 2004-240241 has disclosed a photosensitive composition comprising: a copolymer (A), which is polymerized by an ethylenically unsaturated carboxyl(anhydride), an ethylenically unsaturated compound containing an epoxy group and other unsaturated ethenyl compounds; an ethylenically unsaturated ethenyl polymer (B); and a photoinitiator (C). The photoinitiator (C) is 2-butanedione-[-4-methylthio benzene]-2-(O-oxime acetate), 1,2-butanedione-1-(-4-morpholino phenyl)-2-(O-benzoyl oxime), 1,2-octadione-1-[4-thiophenyl benzene]-2-[O-(4-methyl benzoyl)oxime] or its analogue. Though the photosensitive composition is able to fabricate an overcoat or spacer of high transparency, it presents poor resolution and developability.

Therefore, a photosensitive that enhancing the resolution and developability of the overcoat and spacer at the same time is a target remained to be achieved for the cost concern.

SUMMARY OF THE INVENTION

In the present invention, specific alkali-soluble resin and organic acid are provided to obtain a photosensitive resin composition for an overcoat and spacer having the good resolution and good developability at the same time.

Therefore, the invention relates to a photosensitive resin composition comprising:

an alkali-soluble resin (A), wherein the alkali-soluble resin (A) comprises a resin having an unsaturated group (A-1) synthesized by polymerizing a mixture, and the mixture comprises an epoxy compound having at least two epoxy groups (i) and a compound having at least one carboxyl group and at least one vinyl unsaturated group (ii);

a compound having an ethylenically unsaturated group (B);

a photoinitiator (C);

a solvent (D); and an organic acid (E);

wherein a molecular weight of said organic acid (E) is below 1000.

The present invention also provides a method for forming a thin film on a substrate comprising applying the photosensitive resin composition as mentioned above on the substrate; preferably, the thin film is an overcoat or a spacer.

The present invention also provides a thin film on a substrate, which is obtained by the method as mentioned above.

The present invention further provides a liquid crystal display component comprising the thin film as mentioned above

DETAILED DESCRIPTION OF THE INVENTION

The invention relates to a photosensitive resin composition comprising:

an alkali-soluble resin (A), wherein the alkali-soluble resin (A) comprises a resin having an unsaturated group (A-1) synthesized by polymerizing a mixture, and the mixture comprises an epoxy compound having at least two epoxy groups (i) and a compound having at least one carboxyl group and at least one vinyl unsaturated group (ii);

a compound having an ethylenically unsaturated group (B);

a photoinitiator (C);

a solvent (D); and an organic acid (E);

wherein a molecular weight of said organic acid (E) is below 1000.

The alkali-soluble resin (A) according to the present invention comprises a resin having an unsaturated group (A-1) synthesized by polymerizing a mixture, and the mixture comprises an epoxy compound having at least two epoxy groups (i) and a compound having at least one carboxyl group and at least one vinyl unsaturated group (ii). In addition, the mixture further optionally includes a carboxylic acid anhydride compound (iii) and/or a compound containing an epoxy group (iv).

In one embodiment of the invention, the aforementioned epoxy compound having at least two epoxy groups (i) is represented by Formula (1):

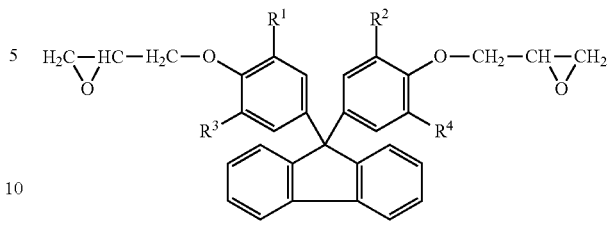

Formula (1)

wherein:

$R^1$ to $R^4$ independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms.

The aforementioned epoxy compound having at least two epoxy groups (i) represented by Formula (1) can include but be not limited to bisphenol fluorene compound containing an epoxy group that is obtained by reacting bisphenol fluorene compound with epihalohydrin.

In detail, examples of the aforementioned bisphenol fluorene compound can include but be not limited to 9,9-bis(4-hydroxyphenyl) fluorene, 9,9-bis (4-hydroxy-3-methylphenyl) fluorene, 9,9-bis (4-hydroxy-3-chlorophenyl) fluorene, 9,9-bis (4-hydroxy-3-bromophenyl) fluorene, 9,9-bis (4-hydroxy-3-fluorophenyl) fluorene, 9,9-bis (4-hydroxy-3-methoxyphenyl) fluorene, 9,9-bis (4-hydroxy-3,5-dimethylphenyl) fluorene, 9,9-bis (4-hydroxy-3,5-dichlorophenyl) fluorene, 9,9-bis(4-hydroxy-3,5-dibromophenyl) fluorene and so on.

Suitable examples of the aforementioned epihalohydrin can include but be not limited to 3-chloro-1,2-epoxypropane (epichlorohydrin), 3-bromo-1,2-epoxypropane (epibromohydrin) and so on.

The resulted bisphenol fluorene compound containing an epoxy group may include but be not limited to the commercially available products such as: (1) ESF-300 manufactured by NIPPON STEEL CHEMICAL Co., Ltd.; (2) PG-100, EG-210 and the like manufactured by OSAKA GAS Co., Ltd.; (3) SMS-F9PhPG, SMS-F9CrG, SMS-F914PG and the like manufactured by S.M.S Technology Co.

In another embodiment of the invention, the aforementioned epoxy compound having at least two epoxy groups (i) is represented by Formula (2):

Formula (2)

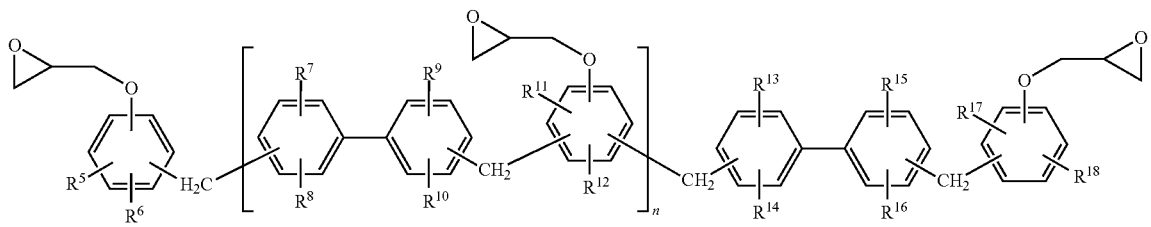

wherein:
R$^5$ to R$^{18}$ independently represents a hydrogen atom, a halogen atom, an alkyl group with one to eight carbon atoms or an aromatic group with six to fifteen carbon atoms; and n represents an integer of zero to ten.

The aforementioned epoxy compound having at least two epoxy groups (i) represented by Formula (2) can be obtained by reacting a compound represented by Formula (2-1) with halogenated epoxypropane in the presence of an alkali metal hydroxide:

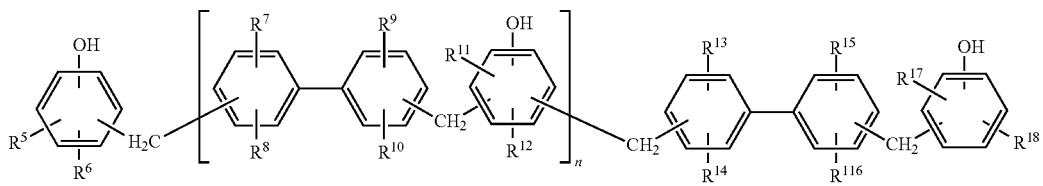

Formula (2-1)

In the Formula (2-1), R$^5$ to R$^{18}$ and n have the same definitions with those of Formula (2) respectively rather than being reciting them in detail.

Furthermore, the aforementioned epoxy compound having at least two epoxy groups (i) represented by Formula (2) is condensed with a compound represented by Formula (2-2) and phenol in the presence of an acid catalyst, thereby forming the compound represented by Formula (2-1). Next, a dehydrohalogenation is carried out by adding excess of halogenated epoxypropane into the above reaction solution, so as to obtain the epoxy compound having at least two epoxy groups (i) represented by Formula (2).

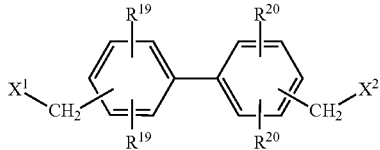

Formula (2-2)

In the Formula (2-2), R$^{19}$ and R$^{20}$ are the same or different from each other, each of which independently represent a hydrogen atom, a halogen atom, an alkyl group with one to eight carbon atoms or an aromatic hydrocarbon group with six to fifteen carbon atoms; X$^1$ and X$^2$ independently represent a halogen atom, an alkyl group with one to six carbon atoms or an alkoxy group with one to six carbon atoms. Preferably, the halogen atom may be chlorine or bromine; the alkyl group may be methyl, ethyl or tert-butyl group; the alkoxy group may be methoxy or ethoxy group.

Appropriate examples of the aforementioned phenols may include but be not limited to: phenol, cresol, ethylphenol, n-propylphenol, isobutylphenol, t-butylphenol, octylphenol, nonylphenol, xylenol, methylbutylphenol, di-t-butylphenol, vinylphenol, propenylphenol, ethinylphenol, cyclopentylphenol, cyclohexylphenol, cyclohexylcresol and the like. Typically, the aforementioned phenols may be used alone or in combinations of two or more.

Based on an amount of the compound represented by Formula (2-2) as 1 mole, an amount of the phenols is typically 0.5 to 20 moles, preferably 2 to 15 moles.

Examples of the aforementioned acid catalyst may include but be not limited to: hydrogen chloride, sulfuric acid, p-toluenesulfonic acid, oxalic acid, boron trifluoride, aluminium chloride anhydrous, zinc chloride and the like. However, p-toluenesulfonic acid, hydrogen chloride and sulfuric acid are preferably used. Typically, the aforementioned acid catalyst may be used alone or in combinations of two or more.

In addition, there are no limitations specific to the amount of the aforementioned acid catalyst. However, in the preferable condition, based on 100 percentages by weight of the compound represented by Formula (2-2), an amount of the acid catalyst is typically 0.1 to 30 percentages by weight.

The aforementioned condensation reaction can be performed without any solvent or in the presence of an organic solvent. Examples of the aforementioned organic solvent may include but be not limited to toluene, xylene, methyl isobutyl ketone and so on. The aforementioned organic solvent may be used alone or in combinations of two or more.

Based on the total weight of the compound represented by Formula (2-2) and the phenols as 100 percentages by weight, an amount of the organic solvent is typically 50 to 300 percentages by weight, and preferably 100 to 250 percentages by weight. In addition, the aforementioned condensation reaction is operated under a temperature of 40° C. to 180° C. for a period of 1 hour to 8 hours.

After the condensation reaction is finished, a neutralization or rinse treatment can be performed. In the aforementioned neutralization treatment, pH value of the reaction solution is adjusted to pH 3 to pH 7, and preferably pH 5 to pH 7. A neutralization reagent may be used in the aforementioned rinse treatment, in which the neutralization reagent is an alkaline substance and its examples may include but be not limited to alkali metal hydroxides such as sodium hydroxide, potassium hydroxide and the like; alkaline earth metal hydroxides such as calcium hydroxide, magnesium hydroxide and the like; organic amines such as diethylene triamine, triethylenetetramine, aniline, phenylene diamine and the like; and ammonia, sodium dihydrogen phosphate and so on. Conventional methods can be used in the aforementioned rinse treatment. For example, a neutralizing reagent-containing solution is added into the reaction solution followed by repetitively extracting. After the neutralization or rinse treatment is finished, unreactive phenols and solvents in the product are evaporated and removed by using a heating treatment under decreased pressure, and then concentrated, thereby obtaining the compound represented by Formula (2-1).

Examples of the aforementioned halogenated epoxypropane (epihalohydrin) may include but be not limited to 3-chloro-1,2-epoxypropane (epichlorohydrin), 3-bromo-1,2-epoxypropane (epibromohydrin) and the combination thereof. Before proceeding the aforementioned dehydrohalogenation, alkali metal hydroxides such as sodium hydroxide, potassium hydroxide can be added before or during the reaction process. The aforementioned dehydrohalogenation is carried out under a temperature of 20° C. to 120° C. for a period of 1 hour to 10 hours.

In an embodiment, the formulation of the alkali metal hydroxide can be also used in an aqueous solution for adding into the aforementioned dehydrohalogenation reaction system. In this example, when the solution of the alkali metal hydroxides is continuously added into the dehydrohalogenation reaction system, water and halogenated epoxypropane (epihalohydrin) can be simultaneously distillated out under a normal or decreased pressure, thereby separating and removing water, as well as reflowing the epihalohydrin back into the reaction system continuously.

Before the aforementioned dehydrohalogenation is carried out, a tertiary ammonium salt such as tetramethyl ammonium chloride, tetramethyl ammonium bromide, trimethyl benzyl ammonium chloride or the like can be used as a catalyst and added into the dehydrohalogenation reaction system, followed by performing the dehydrohalogenation under a temperature of 50° C. to 150° C. for a period of 1 hour to 5 hours. Next, the alkali metal hydroxide or its solution can be then added into such reaction system under a temperature of 20° C. to 120° C. for a period of 1 hour to 10 hours for carrying out the dehydrohalogenation.

Based on the total hydroxyl equivalent amount of the compound represented by Formula (2-2) as 1 equivalent, an amount of the epihalohydrin is typically 1 to 20 equivalents, preferably 2 to 10 equivalents. Based on the total hydroxyl groups in the compound represented by Formula (2-1) as 1 equivalent, an amount of the alkali metal hydroxide added in the dehydrohalogenation is typically 0.8 to 15 equivalents, preferably 0.9 to 11 equivalents.

In addition, for the purpose of successful execution of the dehydrohalogenation, a polar aprotic solvent such as dimethyl sulfone, dimethyl sulfoxide and the like can be also added. When an alcohol is used in the reaction, based on 100 percentages by weight of the epihalohydrin, an amount of the alcohol is 2 to 20 percentages by weight, and preferably 4 to 15 percentages by weight. When the polar aprotic solvent is used in the reaction, based on 100 percentages by weight of the epihalohydrin, an amount of the polar aprotic solvent is 5 to 100 percentages by weight, and preferably 10 to 90 percentages by weight.

After the dehydrohalogenation is completed, a rinse treatment is optionally performed. Afterward, the epihalohydrin, the alcohol and the polar aprotic solvent can be removed by using a heating treatment of 110° C. to 250° C. under decreased pressure of less than 1.3 kPa (10 mmHg).

For preventing the resulted epoxy resin from remaining hydrolytic halogen therein, toluene, methyl isobutyl ketone or the like can be added into the solution that has reacted after the dehydrohalogenation, and then the solution of the alkali metal hydroxide such as sodium hydroxide, potassium hydroxide can be added to perform the dehydrohalogenation again. During the dehydrohalogenation, based on the total hydroxyl groups in the compound represented by Formula (2-1) as 1 equivalent, an amount of the alkali metal hydroxide added in the dehydrohalogenation is typically 0.01 to 0.3 moles, preferably 0.05 to 0.2 moles. In addition, the dehydrohalogenation is operated in a temperature of 50° C. to 120° C. for a period of 0.5 hour to 2 hours.

After the dehydrohalogenation is finished, salts can be removed by using processes of filtration, rinse and so on. In addition, toluene, methyl isobutyl ketone or the like can be distilled out and removed, thereby obtaining an epoxy compound having at least two epoxy groups (i). The epoxy compound having at least two epoxy groups (i) the commercially available products such as NC-3000, NC-3000H, NC-3000S, NC-3000P and the like manufactured by NIPPON KAYAKU Co., Ltd.

In one embodiment of the invention, the aforementioned compound having at least one carboxyl group and at least one vinyl unsaturated group (ii) is selected from the group consisting of the following subgroups (1) to (3): (1) acrylic acid, methacrylic acid, 2-methacryloyloxyethyl butanedioic acid, 2-methacryloyloxybutyl butanedioic acid, 2-methacryloyloxyethyl hexanedioic acid, 2-methacryloyloxybutyl hexanedioic acid, 2-methacryloyloxyethyl cis-hexahydrophthalic acid, 2-methacryloyloxyethyl maleic acid, 2-methacryloyloxypropyl maleic acid, 2-methacryloyloxybutyl maleic acid, 2-methacryloyloxypropyl butanedioic acid, 2-methacryloyloxypropyl hexanedioic acid, 2-methacryloyloxypropyl tetrahydrophthalic acid, 2-methacryloyloxypropyl hydrophthalic acid, 2-methacryloyloxybutyl hexahydrophthalic acid or 2-methacryloyloxybutyl hydrophthalic acid; (2) a compound obtained by reacting (methyl) acrylate ester having hydroxyl group(s) with a dicarboxylic acid compound, in which the dicarboxylic acid compound may include but be not limited to hexanedioic acid, butanedioic acid, maleic acid and phthalic acid; (3) a compound obtained by reacting (methyl)acrylate ester having a hydroxyl group with a carboxylic acid anhydride compound (iii), in which the (methyl)acrylate ester having a hydroxyl group may include but be not limited to (2-hydroxyethyl) acrylate, (2-hydroxyethyl) methacrylate, (2-hydroxypropyl) acrylate, (2-hydroxypropyl) methacrylate, (4-hydroxybutyl) acrylate, (4-hydroxybutyl) methacrylate, pentaerythritol triacrylate and so on. In addition, the carboxylic acid anhydride compound described herein is the same with the carboxylic acid anhydride compound (iii) in the aforementioned mixture of the resin having an unsaturated group (A-1) rather than being recited herein.

As aforementioned, the mixture of the resin having an unsaturated group (A-1) can optionally include the carboxylic acid anhydride compound (iii) and/or the compound containing an epoxy group (iv). The carboxylic acid anhydride compound (iii) can be selected from the group consisting of the following subgroups (1) to (2): (1) a dicarboxylic acid anhydride compound such as butanedioic anhydride, maleic anhydride, itaconic anhydride, phthalic anhydride, tetrahydrophthalic anhydride, hexahydrophthalic anhydride, methyltetrahydrophthalic anhydride, methylhexahydrophthalic anhydride, methyl endo-methylene tetrahydrophthalic anhydride, chlorendic anhydride, 1,3-dioxoisobenzofuran-5-carboxylic anhydride and the like; and (2) a tetracarboxylic acid anhydride compound such as benzophenone tetracarboxylic dianhydride (BTDA), diphthalic dianhydride, diphenyl ether tetracarboxylic acid dianhydride and the like.

The aforementioned compound containing an epoxy group (iv) is selected from the group consisting of glycidyl methacrylate, 3,4-epoxycyclohexyl methacrylate, glycidyl ether compound having an unsaturated group, unsaturated compound having an epoxy group or any combination thereof. The glycidyl ether compound having an unsaturated group may include but be not limited to the commercially available products such as Denacol EX-111, Denacol EX-121, Denacol EX-141, Denacol EX-145, Denacol EX-146, Denacol EX-171, Denacol EX-192 and so on manufactured by Nagase ChemteX Corporation.

The aforementioned resin having an unsaturated group (A-1) can be synthesized as follows. The epoxy compound having at least two epoxy groups (i) and the compound having at least one vinyl unsaturated group and at least one carboxyl group (ii) are polymerized and formed to an intermediate product having a hydroxyl group, and then the intermediate product reacts with the carboxylic acid anhydride compound (iii), so as to obtain the resin having an unsaturated group (A-1). Preferably, based on the total hydroxyl equivalent amount of the intermediate product having an hydroxyl group as 1 equivalent, the total anhydride equivalent amount of the carboxylic acid anhydride compound (iii) is 0.4 to 1 equivalent, and preferably 0.75 to 1 equivalent. When a plurality of the carboxylic acid anhydride compound (iii) are used in this reaction, they can be added sequentially or simultaneously in the reaction. Preferably, when dicarboxylic acid anhydride compound and tetracarboxylic acid anhydride compound are employed as the carboxylic acid anhydride compound (iii), the molar ratio of dicarboxylic acid anhydride compound to the tetracarboxylic acid anhydride compound may be 1/99 to 90/10, and preferably 5/95 to 80/20. In addition, this reaction can be operated under a temperature of 50° C. to 130° C.

The aforementioned resin having an unsaturated group (A-1) can be synthesized as follows. The epoxy compound having at least two epoxy groups (i) and the compound having at least one vinyl unsaturated group and at least one carboxyl group (ii) both represented by Formula (2) react with each other to form an intermediate product having a hydroxyl group. And then, the intermediate product reacts with the carboxylic acid anhydride compound (iii) and/or a compound containing an epoxy group (iv), so as to obtain the resin having an unsaturated group (A-1). Preferably, based on the total epoxy equivalent amount of the epoxy compound having at least two epoxy groups (i) represented by Formula (2) as 1 equivalent, the total acid equivalent amount of the compound having at least one vinyl unsaturated group and at least one carboxyl group (ii) is 0.8 to 1.5 equivalent, and preferably 0.9 to 1.1 equivalent. Based on the total hydroxyl equivalent amount of the intermediate product having a hydroxyl group as 100 percentage by mole (mole %), an amount of the carboxylic acid anhydride compound (iii) is 10 to 100 mole %, preferably 20 to 100 mole %, and more preferably 30 to 100 mole %.

During the preparation of the resin having an unsaturated group (A-1), the reaction solution is usually added with an alkaline compound as a reaction catalyst for accelerating the reaction. The reaction catalyst may be used alone or in combinations of two or more, and the reaction may include but be not limited to triphenyl phosphine, triphenyl stibine, triethylamine, triethanolamine, tetramethylammonium chloride, benzyltriethylammonium chloride and the like. Preferably, based on a total weight of the epoxy compound having at least two epoxy groups (i) and the compound having at least one vinyl unsaturated group and at least one carboxyl group (ii) as 100 parts by weight, an amount of the reaction catalyst is 0.01 to 10 parts by weight, and preferably 0.3 to 5 parts by weight.

In addition, for the purpose of controlling the polymerization degree, a polymerization inhibitor is usually added into the reaction solution. The aforementioned polymerization inhibitor may include but be not limited to methoxyphenol, methylhydroquinone, hydroquinone, 2,6-di-t-butyl-p-cresol, phenothiazine and the like. Typically, the polymerization inhibitor may be used alone or in combinations of two or more. Based on the total weight of the epoxy compound having at least two epoxy groups (i) and the compound having at least one vinyl unsaturated group and at least one carboxyl group (ii) as 100 parts by weight, an amount of the polymerization inhibitor is 0.01 to 10 parts by weight, and preferably 0.1 to 5 parts by weight.

During the preparation of the resin having an unsaturated group (A-1), a polymerization solvent can be use if necessary. Examples of the polymerization solvent may include but be not limited to alcohol compounds such as ethanol, propanol, isopropanol, butanol, isobutanol, 2-butanol, hexanol or ethylene glycol; ketone compounds such as methyl ethyl ketone or cyclohexanone; aromatic hydrocarbon compounds such as toluene or xylene; cellosolve compounds such as cellosolve or butyl cellosolve; carbitol compounds such as carbitol or butyl carbitol; propylene glycol alkyl ether compounds such as propylene glycol monomethyl ether; poly(propylene glycol)alkyl ether compounds such as di(propylene glycol) methyl ether, acetate ester compounds such as ethyl acetate, butyl acetate, ethylene glycol monoethyl ether acetate, propylene glycol methyl ether acetate and the like; alkyl lactate compounds such as ethyl lactate or butyl lactate; or dialkyl glycol ethers. The aforementioned polymerization solvent may be used alone or in combinations of two or more. An acid equivalent of the resin having an unsaturated group (A-1) is 50 mg KOH/g to 200 mg KOH/g, and preferably 60 mg KOH/g to 150 mg KOH/g.

The used amount of the resin having an unsaturated group (A-1) is from 30 to 100 parts by weight based on 100 parts by weight of the used amount of the alkali-soluble resin (A); preferably 50 to 100 parts by weight, and more preferably 70 to 100 parts by weight. When the photosensitive resin composition has no the resin having an unsaturated group (A-1), the resulted photosensitive resin composition would have disadvantages such as poor resolution.

The alkali-soluble resin (A) described herein may further include other alkali-soluble resin (A-2). If incorporating the resin having an unsaturated group (A-1) and other alkali-soluble resin (A-2), the resolution is improved.

The wording "(meth)acrylic acid" used herein indicates acrylic acid and/or methacrylic acid; "(meth)acryloyl" indicates acryloyl and/or methacryloyl; and "(meth)acrylate" indicates acrylate and/or methacrylate.

The other alkali-soluble resin (A-2) refers to a compound able to be dissolved in an alkali solution with its structure not particularly limited. In the preferred embodiment of the present invention, the other alkali-soluble resin (A-2) refers to a resin containing a carboxylic acid and phenol-novolac resin, etc. More preferably, said other alkali-soluble resin (A-2) is polymerized with an unsaturated carboxylic acid or unsaturated carboxylic acid anhydride compound (a1), an unsaturated compound containing an epoxy group (a2), and/or an other unsaturated compound (a3) in a solvent with an appropriate polymerization initiator.

The preferred composition ratio of the unsaturated carboxylic acid or unsaturated carboxylic acid anhydride compound (a1) according to the present invention is 5 to 50 parts by weight. The unsaturated carboxylic acid or unsaturated carboxylic acid anhydride compound (a1) refers to a compound containing carboxylic acid or carboxylic acid anhydride structure and unsaturated bond for polymerization, with its structure not particularly limited, e.g., an unsaturated monocarboxylicacid compound, an unsaturated dicarboxylic acid compound, an unsaturated anhydride compound, a polycyclic unsaturated carboxylic acid compound, a polycyclic unsaturated dicarboxylic acid compound, and a polycyclic unsaturated anhydride compound.

In one embodiment of the present invention, the unsaturated monocarboxylic acid compound refers to (meth)acrylic acid, butenoic acid, α-chloroacrylic acid, ethyl acrylic acid, cinnamic acid, 2-(meth)acryloyloxyethyl succinate, 2-(meth) acryloyloxyethyl hexahydrophthate, 2-(meth)acryloyloxyethyl phthate, and omega-carboxyl polycaprolactone polyol monoacrylic acid (trade name as ARONIX M-5300, made by Toagosei).

In one embodiment of the present invention, the unsaturated dicarboxylic acid compound refers to maleic acid, fumaric acid, methyl fumaric acid, itaconic acid, and citraconic acid, etc. In one embodiment of the present invention, the unsaturated dicarboxylic acid anhydride compound refers to an anhydride compound of said unsaturated dicarboxylic acid compound.

In one embodiment of the present invention, the polycyclic unsaturated carboxylic acid compound refers to 5-carboxyl-bicyclo[2.2.1]hept-2-ene, 5-carboxyl-5-methylbicyclo[2.2.1]hept-2-ene, 5-carboxyl-5-ethylbicyclo[2.2.1]hept-2-ene, 5-carboxyl-6-methylbicyclo[2.2.1]hept-2-ene, and 5-carboxyl-6-ethylbicyclo[2.2.1]hept-2-ene.

In one embodiment of the present invention, the polycyclic unsaturated dicarboxylic acid compound refers to the 5,6-dicarboxylicbicyclo[2.2.1]hept-2-ene. In one embodiment of the present invention, the polycyclic unsaturated dicarboxylic acid anhydride compound refers to an anhydride compound of said polycyclic unsaturated dicarboxylic acid compound.

In one embodiment of the present invention, the unsaturated carboxylic acid or unsaturated carboxylic acid anhydride compound (a1) refers to acrylic acid, methacrylic acid, maleic anhydride, 2-methacrylethoxyl succinic acid, and 2-methacrylethoxyl hexahydrophthalic acid. The unsaturated carboxylic acid or unsaturated carboxylic acid anhydride compound (a1) can be used independently or mixedly.

The preferred composition ratio of the unsaturated compound containing an epoxy group (a2) according to the present invention is 10 to 70 parts by weight. Examples of the unsaturated compound containing an epoxy group (a2) are as follows: (meth)acrylate compound containing an epoxy group, α-alkyl acrylate compound containing an epoxy group, and epoxypropyl ether.

In one embodiment of the present invention, the (meth)acrylate compound containing an epoxy group refers to epoxypropyl (meth)acrylate (glycidyl (meth)acrylate), 2-methyl epoxypropyl (meth)acrylate, 3,4-epoxybutyl (meth)acrylate, 6,7-epoxyheptyl (meth)acrylate, 3,4-epoxycyclohexyl (meth)acrylate, and 3,4-epoxycyclohexylmethyl (meth)acrylate.

In one embodiment of the present invention, the α-alkyl acrylate compound containing an epoxy group refers to α-ethyl epoxypropyl acrylate, α-n-propyl epoxypropyl acrylate, α-n-butyl epoxypropyl acrylate, and α-ethyl 6,7-epoxyheptyl acrylate.

In one embodiment of the present invention, the epoxypropyl ether refers to o-vinylbenzylglycidylether, m-vinylbenzylglycidylether), and p-vinylbenzylglycidylether.

The preferred embodiment of the present invention, the unsaturated compound containing an epoxy group (a2) refers to epoxypropyl (meth)acrylate (glycidyl (meth)acrylate), 3,4-epoxycyclohexylmethyl (meth)acrylate, 6,7-epoxyheptyl (meth)acrylate, o-vinylbenzylglycidylether, m-vinylbenzylglycidylether), and p-vinylbenzylglycidylether.

The preferred composition ratio of the other unsaturated compound (a3) is 0 to 70 parts by weight. Examples of said other unsaturated compound (a3) are alkyl (meth)acrylate, alicyclic (meth)acrylate, aryl (meth)acrylate, unsaturated dicarboxylic acid diester, hydroxyalkyl (meth)acrylate, polyether of (meth)acrylate, an aromatic ethylene compound, and other unsaturated compounds.

In one embodiment of the present invention, the alkyl (meth)acrylate refers to methyl (meth)acrylate, ethyl (meth)acrylate, n-propyl (meth)acrylate, isopropyl (meth)acrylate, n-butyl (meth)acrylate, isobutyl (meth)acrylate, dibutyl (meth)acrylate, and tert-butyl (meth)acrylate.

In one embodiment of the present invention, the alicyclic (meth)acrylate refers to cyclohexyl (meth)acrylate, 2-methyl cyclohexyl (meth)acrylate, tricyclic [5.2.1.0$^{2,6}$]decane-8-ol (meth)acrylate (also called dicyclopentanyl (meth)acrylate), bicyclic pentyloxy ethyl (meth)acrylate, isobornyl (meth) acrylate, and tetrahydrofuran (meth)acrylate.

In one embodiment of the present invention, the aryl (meth)acrylate refers to phenyl (meth)acrylate and benzyl (meth)acrylate.

In one embodiment of the present invention, the unsaturated dicarboxylic acid diester refers to diethyl maleate, diethyl fumarate, and diethylitaconate.

In one embodiment of the present invention, the hydroxyalkyl refers to 2-hydroxyethyl (meth)acrylate and 2-hydroxypropyl (meth)acrylate.

In one embodiment of the present invention, the polyether of (meth)acrylate refers to polyethylene glycol mono(meth)acrylate and polypropylene glycol mono(meth)acrylate.

In one embodiment of the present invention, the aromatic ethylene compound refers to styrene, α-methylstyrene, m-methylstyrene, o-methylstyrene, and p-methoxystyrene.

In one embodiment of the present invention, other unsaturated compounds refer to acrylonitrile, methacrylonitrile, vinyl chloride, vinylidene chloride, acrylamide, methacrylamide, ethylacetate, 1,3-butadiene, isoprene, 2,3-dimethyl 1,3-butadiene, N-cyclohexylmaleimide, N-phenylmaleimide, N-benzylmaleimide, N-succinimidoyl-3-maleimidylbenzoate, N-succinimidoyl-4-maleimidylbutyrate, N-succinimidoyl-6-maleimidylhexanoate, N-succinimidoyl-3-maleimidylpropionate, and N-(9-acridinyl)maleimide.

The preferred embodiments of the other unsaturated compound (a3) are methyl (meth)acrylate, n-butyl (meth)acrylate, 2-hydroxyethyl (meth)acrylate, tert-butyl (meth)acrylate, phenmethylmethacrlate, bicyclic pentyloxy ethyl (meth) acrylate, styrene, and p-methoxystyrene. The other unsaturated compound (a3) according to the invention can be used independently or mixedly.

In one embodiment of the present invention, the solvent used for synthesizing the other alkali-soluble resin (A-2) is an alcohol, ether, glycol ether, ethylene glycol alkyl ether acetate, diethylene glycol, dipropylene glycol, propylene glycol monoalkyl ether, propylene glycol alkyl ether acetate, propylene glycol alkyl ether propionate, aromatic hydrocarbon, ketone, and ester.

In one embodiment of the present invention, the alcohol refers to methanol, ethanol, benzyl alcohol, 2-phenylethanol, and 3-phenyl-1-propanol.

In one embodiment of the present invention, the ether refers to tetrahydrofuran.

In one embodiment of the present invention, the glycol ether refers to ethylene glycol monopropyl ether, ethylene glycol monomethyl ether, and ethylene glycol monoethyl ether.

In one embodiment of the present invention, the ethylene glycol alkyl ether acetate refers to ethylene glycol butyl ether acetate, ethylene glycol ethyl ether acetate, and ethylene glycol methyl ether acetate.

In one embodiment of the present invention, the diethylene glycol refers to diethylene glycol monomethyl ether, diethylene glycol monoethyl ether, diethylene glycol monobutyl ether, diethylene glycol dimethyl ether, diethylene glycol diethyl ethe, and diethylene glycol methylethyl ether.

In one embodiment of the present invention, the dipropylene glycol refers to dipropylene glycol monomethyl ether, dipropylene glycol monoethyl ether, dipropylene glycol dimethyl ether, dipropylene glycol diethyl ether, and dipropylene glycol methylethyl ether.

In one embodiment of the present invention, the propylene glycol monoalkyl ether refers to propylene glycol monomethyl ether, propylene glycol monoethyl ether, propylene glycol monopropyl ether and propylene glycol monobutyl ether.

In one embodiment of the present invention, the propylene glycol alkyl ether acetate refers to propylene glycol methyl ether acetate, propylene glycol ethyl ether acetate, propylene glycol propyl ether acetate, and propylene glycol butyl ether acetate.

In one embodiment of the present invention, the propylene glycol alkyl ether propionate refers to propylene glycol methyl ether propionate, propylene glycol diethyl ether propionate, propylene glycol propyl ether propionate, and propylene glycol butyl ether propionate.

In one embodiment of the present invention, the aromatic hydrocarbon refers to toluene and dimethylbenzene.

In one embodiment of the present invention, said ketone refers to methyl ethyl ketone, cyclohexanone and diacetone Alcohol.

In one embodiment of the present invention, said ester refers to methyl acetate, ethyl acetate, propyl acetate, butyl acetate, ethyl 2-hydroxy propionate, methyl 2-hydroxy-2-methyl propionate, ethyl 2-hydroxy-2-methyl propionate, methyl glycolate, ethyl glycolate, butyl glycolate, methyl lactate, propyl lactate, butyl lactate, methyl 3-hydroxy propionate, ethyl 3-hydroxy propionate, propyl 3-hydroxy propionate, butyl 3-hydroxy propionate, methyl 2-hydroxy-3-methyl butanoate, methyl methoxy acetate, ethyl methoxy acetate, butyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, butyl 3-methoxyl acetate, methyl 2-methoxy propionate, ethyl 2-methoxy propionate, propyl 2-methoxy propionate, butyl 2-methoxy propionate, methyl 2-ethoxy propionate, ethyl 2-ethoxy propionate, propyl 2-ethoxy propionate, butyl 2-ethoxy propionate, methyl 2-butoxy propionate, ethyl 2-butoxy propionate, propyl 2-butoxy propionate, butyl 2-butoxy propionate, methyl 3-methoxy propionate, ethyl 3-methoxy propionate, propyl 3-methoxy propionate, butyl 3-methoxy propionate, methyl 3-ethoxy propionate, ethyl 3-ethoxy propionate, propyl 3-ethoxy propionate, butyl 3-ethoxy propionate, methyl 3-propoxy propionate, ethyl 3-propoxy propionate, propyl 3-propoxy propionate, butyl 3-propoxy propionate, methyl 3-butoxy propionate, ethyl 3-butoxy propionate, propyl 3-butoxy propionate, and butyl 3-butoxy propionate.

In one preferred embodiment of the present invention, the solvent used for synthesizing the other alkali-soluble resin (A-2) is diethylene dlycol dimethyl ether and propylene glycol methyl ether acetate. The solvent used for synthesizing the other alkali-soluble resin (A-2) according to the invention can be used independently or mixedly.

Examples of the polymerization initiator used for synthesizing the other alkali-soluble resin (A-2) according to the present invention are an azo compound or a peroxide.

Examples of said azo compound are 2,2-azodiisobutyronitrile, 2,2'-azobis(2,4-dimethylvaleronitrile), 2'-azobis(4-methoxy-2,4-dimethylvaleronitrile), 2,2'-azobis-2-methylbutyronitrile, 4,4'-azobis(4-cyanovaleric acid), dimethyl 2,2'-azobis(2-methyl propionate), and 2,2'-azobis(4-methoxyl-2,4-dimethylvaleronitrile).

Examples of said peroxide are benzoyl peroxide, dilauroyl peroxide, tert-butyl peroxypivalate, 1,1-di(tert-butylperoxy) cyclohexane, and hydrogen peroxide.

The polymerization initiator used for synthesizing the alkali-soluble resin (A) according to the present invention can be used independently or mixedly.

The average molecular weight of the other alkali-soluble resin (A-2) according to the present invention is generally 3,000 to 100,000; preferably 4,000 to 80,000; more preferably 5,000 to 60,000. The molecular weight of the other alkali-soluble resin (A-2) can be adjusted by using a single resin or two or more resins with different molecular weights.

The used amount of the other alkali-soluble resin (A-2) is from 0 to 70 parts by weight based on 100 parts by weight of the used amount of the alkali-soluble resin (A); preferably from 0 to 60 parts by weight; more preferably from 0 to 50 parts by weight.

The compound having an ethylenically unsaturated group (B) described herein can include but be not limited to a compound having at least one ethylenically unsaturated group or a compound having at least two ethylenically unsaturated groups (including two vinyl unsaturated groups).

The compound having at least one ethylenically unsaturated group can include but be not limited to (meth)acrylamide, (meth)acryloyl morpholine, 7-amine-3,7-dimethyloctyl (meth)acrylate, isobutoxymethyl (meth)acrylamide, isobornyloxyethyl (meth)acrylate, isobornyl (meth)acrylate, 2-ethylhexyl (meth)acrylate, ethyldiethylene glycol (meth) acrylate, t-octyl (meth)acrylamide, diacetone (meth)acrylamide, dimethylaminoethyl (meth)acrylamide, dodecyl (meth)acrylamide, dicyclopentenyloxyethyl (meth)acrylate, dicyclopentadiene (meth)acrylate, N,N-dimethyl(meth)acrylamide, tetrachlorophenyl (meth)acrylate, 2-tetrachlorophenoxyethyl (meth)acrylate, tetrahydrofurfuryl (meth)acrylate, tetrabromophenyl (meth)acrylate, 2-tetrabromophenoxyethyl (meth)acrylate, 2-trichlorophenoxyethyl (meth)acrylate, tribromophenyl (meth)acrylate, 2-tribromophenoxyethyl (meth)acrylate, 2-hydroxyethyl (meth)acrylate, 2-hydroxypropyl (meth)acrylate, vinylcaprolactam, N-vinylpyrrolidone, phenoxyethyl (meth)acrylate, pentachlorophenyl (meth)acrylate, pentachlorophenyl (meth)acrylate, polyethylene glycol mono(meth)acrylate, polypropylene glycol mono(meth)acrylate, bornyl (meth)acrylate and the like. The above-mentioned compound having at least one ethylenically unsaturated group can be used alone or in combinations of two or more.

The compound having at least two ethylenically unsaturated groups (including two vinyl unsaturated groups) can include but be not limited to ethylene glycol di(meth)acrylate, dicyclopentenyl (meth)acrylate, triethylene glycol di(meth) acrylate, tetraethylene glycol di(meth)acrylate, tris(2-hydroxyethyl) isocyanurate di(meth)acrylate, tris(2-hydroxyethyl) isocyanurate tri(meth)acrylate, caprolactone-modified tris(2-hydroxyethyl) isocyanurate tri(meth)acrylate, trimethylolpropyl tri(meth)acrylate, EO-modified trimethylolpropyl tri(meth)acrylate, PO-modified trimethylolpropyl tri(meth)acrylate, tripropylene glycol di(meth)acrylate, neopentyl glycol di(meth)acrylate, 1,4-butanediol di(meth) acrylate, 1,6-hexanediol di(meth)acrylate, pentaerythritol tri(meth)acrylate, pentaerythritol tetra(meth)acrylate, polyester di(meth)acrylate, polyethylene glycol di(meth)acrylate, dipentaerythritol hexa(meth)acrylate, dipentaerythritol penta (meth)acrylate, dipentaerythritol tetra(meth)acrylate, caprolactone-modified dipentaerythritol hexa(meth)acrylate, caprolactone-modified dipentaerythritol penta(meth)acrylate, di(trimethylolpropane) tetra(meth)acrylate, EO-modified bisphenol A di(meth)acrylate, PO-modified bisphenol A di(meth)acrylate, EO-modified hydrogenated bisphenol A di(meth)acrylate, PO-modified hydrogenated bisphenol A di(meth)acrylate, PO-modified glycerol tri(meth)acrylate, EO-modified bisphenol F di(meth)acrylate, novolac polyglycidyl ether (meth)acrylate and the like. The above-mentioned compound having at least two ethylenically unsaturated groups can be used alone or in combinations of two or more.

Examples of the compound having an ethylenically unsaturated group (B) can include but be not limited to trimethylolpropyl triacrylate, EO-modified trimethylolpropyl triacrylate, PO-modified trimethylolpropyl triacrylate, pentaerythritol triacrylate, pentaerythritol tetraacrylate, dipentaerythritol hexaacrylate, dipentaerythritol pentaacrylate, dipentaerythritol tetraacrylate, caprolactone-modified dipentaerythritol hexaacrylate, di(trimethylolpropane)tetraacrylate, PO-modified glycerol triacrylate and any combination thereof.

The used amount of the compound having an ethylenically unsaturated group (B) is from 30 to 300 parts by weight based on 100 parts by weight of the used amount of the alkali-soluble resin (A); preferably from 50 to 250 parts by weight; more preferably from 70 to 200 parts by weight, so that the photosensitive resin composition can exhibit excellent developability.

The photoinitiator (C) of the present invention can include but be not limited to an O-acyloxime compound, a triazine compound, a acetophenone compound, a diimidazole compound, a benzophenone compound, a α-dione (α-diketone) compound, an acyloin compound, an acyloin ether compound, an acylphosphineoxide compound, a quinone compound, a halogen-containing compound, a peroxide and so on, which are respectively described below.

Examples of the O-acyloxime compound include: 1-[4-(phenylthio)phenyl]-heptane-1,2-dione 2-(O-benzoyloxime), 1-[4-(phenylthio)phenyl]-octane-1,2-dione 2-(O-benzoyloxime), 1-[4-(benzoyl)phenyl]-heptane-1,2-dione 2-(O-benzoyloxime), 1-[9-ethyl-6-(2-methylbenzoyl)-9H-carbazole-3-yl]-ethanone 1-(O-acetyloxime), 1-[9-ethyl-6-(3-methyl benzoyl)-9H-carbazole-3-yl]-ethanone 1-(O-acetyloxime), 1-[9-ethyl-6-benzoyl-9H-carbazole-3-yl]-ethanone 1-(O-acetyloxime), ethanone-1-[9-ethyl-6-(2-methyl-4-tetrahydrofuranylbenzoyl)-9H-carbazole-3-yl]-1-(O-acetyloxime), ethanone-1-[9-ethyl-6-(2-methyl-4-tetrahydropyranylbenzoyl)-9H-carbazole-3-yl]-1-(O-acetyloxime), ethanone-1-[9-ethyl-6-(2-methyl-5-tetrahydrofuranylbenzoyl)-9H-carbazole-3-yl]-1-(O-acetyloxime), ethanone-1-[9-ethyl-6-(2-methyl-5-tetrahydropyranylbenzoyl)-9H-carbazole-3-yl]-1-(O-acetyloxime), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-(2-methyl-4-tetrahydropyranylmethoxybenzoyl)-9H-carbazole-3-yl]-1-(O-acetyloxime), ethanone-1-[9-ethyl-6-(2-methyl-5-tetrahydrofuranylmethoxybenzoyl)-9H-carbazole-3-yl]-1-(O-acetyloxime), ethanone-1-[9-ethyl-6-(2-methyl-5-tetrahydropyranyl methoxybenzoyl)-9H-carbazole-3-yl]-1-(O-acetyloxime), ethanone-1-[9-ethyl-6-{2-methyl-4-(2,2-dimethyl-1,3-dioxolanyl)benzoyl}-9-H-carbazole-3-yl]-1-(O-acetyloxime), ethanone-1-[9-ethyl-6-{2-methyl-4-(2,2-dimethyl-1,3-dioxolanyl) methoxybenzoyl}-9H-carbazole-3-yl]-1-(O-acetyloxime) and the like.

Among those O-acyloxime compounds, 1-[4-(phenylthio)phenyl]-octane-1,2-dione 2-(0-benzoyloxime) (for example, the trade name OXE01 manufactured by CIBA SPECIALTY CHEMICALS Corporation), 1-[9-ethyl-6-(2-methylbenzoyl)-9H-carbazole-3-yl]-ethanone 1-(O-acetyloxime) (for example, the trade name OXE02 manufactured by CIBA SPECIALTY CHEMICALS Co.), ethanone-1-[9-ethyl-6-(2-methyl-4-tetrahydrofuranylmethoxybenzoyl)-9H-carbazole-3-yl]-1-(O-acetyloxime), ethanone-1-[9-ethyl-6-{2-methyl-4-(2,2-dimethyl-1,3-dioxolanyl)methoxybenzoyl}-9H-carbazole-3-yl]-1-(O-acetyloxime) and the like are preferred. The aforementioned O-acyloxime compound can be used alone or in combinations of two or more depending on actual requirement.

Examples of the triazine compound include: vinyl-halomethyl-s-triazine compounds, 2-(naphth-1-yl)-4,6-bis-halomethyl-s-triazine compounds and 4-(p-aminophenyl)-2,6-dihalomethyl-s-triazine compounds.

Examples of the vinyl-halomethyl-s-triazine compounds include: 2,4-bis(trichloromethyl)-6-(p-methoxy)styryl-s-triazine, 2,4-bis(trichloromethyl)-3-(1-p-dimethylaminophenyl-1,3-butadienyl)-s-triazine, 2-trichloromethyl-3-amino-6-(p-methoxy)styryl-s-triazine and the like.

Examples of the 2-(naphth-1-yl)-4,6-bis-halomethyl-s-triazine compounds include: 2-(naphtha-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-(4-(2-methoxyethyl-naphtho-1-yl)-4,6-bis-trichloromethyl-s-triazine, 2-(4-(2-ethoxyethyl-naphtho-1-yl)-4,6-bis-trichloromethyl-s-triazine, 2-(4-(2-butoxyethyl-naphtho-1-yl)-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine and the like.

Examples of the 4-(p-aminophenyl)-2,6-di-halomethyl-s-triazine compounds include: 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-[p-N-chloroethylaminophenyl]-2,6-di(trichloromethyl)-s-triazine, 4-[p-N-ethoxycarbonylmethylaminophenyl]-2,6-di(trichloromethyl)-s-triazine, 4-[p-N,N-di(phenypaminophenyl)-2,6-di(trichloromethyl)-s-triazine, 4-[p-N-chloro ethylcarbonylaminophenyl]-2,6-di(trichloromethyl)-s-triazine, 4-[p-N-(p-methoxy phenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxy carbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichlorometh-yl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s- triazine, 4-[m-fluoro-p-N,N-di(chloroethyl)aminophenyl]-2,6-di(trichloromethyl)-s-di(trichloromethyl)-s-triazine, 4-(m-chloro-p-N-ethoxycarbonylmethyl aminophenyl)-2,6-di(trichloromethyl)-s-triazine, 4-(m-fluoro-p-N-ethoxycarbonyl methylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, 2,4-bis(trichloromethyl)-6-[3-bromo-4-[N,N-di(ethoxycarbonylmethyl)amino]-phenyl]-1,3,5-triazine and the like.

Among those triazine compounds, 4-[m-bromo-p-N,N-di(ethoxycarbonylmethyl)aminophenyl]-2,6-di(trichloromethyl)-s-triazine and 2,4-bis(trichloromethyl)-6-(p-methoxy)styryl-s-triazine are preferred. The aforementioned triazine compounds can be used alone or in combinations of two or more depending on actual requirement.

Examples of the acetophenone compound include: p-dimethylaminoacetophenone, α,α'-dimethoxyazoxyacetophenone, 2,2'-dimethyl-2-phenylacetophenone, p-methoxyacetophenone, 2-methyl-1-(4-methylthiophenyl)-2-morpholino-1-propanone, 2-benzyl-2-N,N-dimethylamino-1-(4-morpholinophenyl)-1-butanone and the like. Among those acetophenone compounds, 2-methyl-1-(4-methylthiophenyl)-2-morpholino-1-propanone, 2-benzyl-2-N,N-dimethylamino-1-(4-morpholinophenyl)-1-butanone and the like are preferred. The aforementioned acetophenone compounds can be used alone or in combinations of two or more depending on actual requirement.

Examples of the diimidazole compound include: 2,2'-bis(o-chlorophenyl)-4,4',5,5'-tetraphenylbiimidazole, 2,2'-bis(o-fluorophenyl)-4,4',5,5'-tetraphenyl biimidazole, 2,2'-bis(2,4-dichlorophenyl)-4,4',5,5'-tetraphenylbiimidazole, 2,2'-bis(o-methoxyphenyl)-4,4',5,5'-tetraphenylbiimidazole, 2,2'-bis(o-ethoxyphenyl)-4,4',5,5'-tetraphenylbiimidazole, 2,2'-bis(p-methoxyphenyl)-4,4',5,5'-tetraphenyl biimidazole, 2,2,-bis(2,2',4,4'-tetramethoxyphenyl)-4,4',5,5'-tetraphenyl biimidazole, 2,2,-bis(2chlorophenyl)-4,4',5,5'-tetraphenyl biimidazole, 2,2,-bis(2,4-dichlorophenyl)-4,4',5,5'-tetraphenylbiimidazole and so on. Among those examples, 2,2,-bis(2,4-dichlorophenyl)-4,4',5,5'-tetraphenylbiimidazole is preferred. The aforementioned diimidazole compound can be used alone or in combinations of two or more depending on actual requirement.

Examples of the benzophenone compound include: thioxanthone, 2,4-diethyl thioxanthone, thioxanthone-4-sulfone, benzophenone, 4,4'-bis(dimethylamino)benzophenone, 4,4'-bis(diethylamine)benzophenone and so on. Among those examples, 4,4'-bis(diethylamine)benzophenone is preferred. The aforementioned benzophenone compound can be used alone or in combinations of two or more depending on actual requirement.

Examples of the α-dione compound include: benzil, acetyl and so on. Examples of the acyloin compound include: benzoin. Examples of the acyloin ether compound include: diphenylethyl ether ketone (benzoin methyl ether), benzoin ethylether, benzoin isopropyl ether and so on. Examples of the acylphosphineoxide compound include: 2,4,6-trimethylbenzoyl diphenylphosphineoxide, bis-(2,6-dimethoxy-benzoyl)-2,4,4-trimethylbenzyl phosphineoxide and so on. Examples of the quinone compound include: anthraquinone, 1,4-naphthoquinone and so on. Examples of the halogen-containing compound include: phenacyl chloride, tribromomethyl phenylsulfone, tris(trichloromethyl)-s-triazine and so on. Examples of the peroxide include: di-tertbutylperoxide and so on. The aforementioned α-dione compound, acyloin compound, acyloin ether compound, acylphosphineoxide compound, quinone compound, halogen-containing compound, peroxide and the like can be used alone or in combinations of two or more depending on actual requirement.

The amount of the photoinitiator (C) of the present invention can be adjusted depending on the actual requirement. In an example of the present invention, the used amount of the photoinitiator (C) is from 10 to 80 parts by weight based on 100 parts by weight of the used amount of the alkali-soluble resin (A) preferably 12 to 75 parts by weight, and more preferably 15 to 70 parts by weight.

The solvent (D) according to the invention is able to dissolve other organic components completely and the volatility must be high enough to enable the solvent to be evaporated from the dispersion with a small amount of heat at atmospheric pressure. The solvents with a boiling point below than 150° C. at atmospheric pressure are used most usually. Such solvents are aromatic solvents such as benzene, toluene, and xylene; alcohol solvents, such as methanol and ethanol; ether solvents, such as ethylene glycol monopropyl ether, diethylene glycol dimethyl ether, tetrahydrofuran, ethylene glycol monomethyl ether, ethylene glycol monoethyl ether, diethylene glycol monomethyl ether, diethylene glycol diethyl ether, diethylene glycol monobutyl ether; esters solvents, such as ethylene glycol methyl ether acetate, ethylene glycol ethyl ether acetate, propylene glycol methyl ether acetate, propylene glycol ether acetate, propylene glycol propyl ether acetate, ethyl 3-ethoxypropionate; ketone solvent, such as methyl ethyl ketone and acetone. Preferably, diethylene glycol dimethyl ether, propylene glycol methyl ether acetate and ethyl 3-ethoxypropionate are used alone or in admixture of the two and the storage stability of the photosensitive resin composition is the best.

The amount of the solvent (D) of the present invention can be adjusted depending on the actual requirement. In one embodiment of the invention, the used amount of the solvent (D) is from 200 to 1200 parts by weight based on 100 parts by weight of the used amount of the alkali-soluble resin (A); preferably from 250 to 1100 parts by weight; more preferably from 300 to 1000 parts by weight.

The molecular weight of said organic acid (E) according to the invention is below 1000.

In one embodiment of the invention, examples of the organic acid with the molecular below 1000 include but are not limited to an aliphatic carboxylic acid, alicyclic carboxylic acid, and aromatic carboxylic acid.

Examples of the aliphatic carboxylic acid are mono carboxylic acids such as formic acid, acetic acid, propionic acid), butyric acid, valeric acid, pivalic acid, caproic acid, diethyl acetic acid, heptanoic acid, octanoic acid, and 2-furoic acid; dicarboxylic acids such as oxalic acid, malonic acid, succinic acid, glutaric acid, adipic acid, pimelic acid, suberic acid, azelaic acid, sebacic acid, brassylic acid, methylmalonic acid, ethyl malonate acid, dimethyl malonic acid, methyl succinic acid, tetramethyl succinic acid, itaconic acid, citraconic acid, maleic acid, fumaric acid, and methyl fumaric acid; tricarboxylic acid such as 1,2,3-propanetricarboxylic acid, aconitic acid), and camphoronic acid.

Examples of the alicyclic carboxylic acid are carboxylic acid derivatives having a steroid structure such as cholic acid, deoxycholic acid, and lithocholate; adamantane carboxylic acid derivatives, adamantane dicarboxylic acid, cyclohexyl carboxylic acid, and cyclohexyl dicarboxylic acid.

The aromatic carboxylic acid can be aromatic carboxylic acids wherein a carboxyl group directly links to a phenyl group or carboxylic acids wherein a carboxyl group links to a phenyl group thought a carbon bond. Examples of the aromatic carboxylic acid are aromatic mono carboxylic acid such as benzoic acid, toluic acid, cumin acid, 2,3-dimethylbenzoic acid, and 3,5-dimethylbenzoic acid; aromatic dicarboxylic acid such as phthalic acid, isophthalic acid, and terephthalic acid; aromatic polycarboxylic acid such as trimellitic acid, 1,3,5-benzene tricarboxylic acid, 1,2,3,5-pyromellitic acid, pyromellitic acid; and other aromatic carboxylic acid such as phenyl acetic acid, hydratropic acid, hydrocinnamic acid, mandelic acid, phenyl succinic acid, atropic acid, cinnamic acid, cinnamylideneacetic acid, coumaric acid, umbellic acid. The organic acid can be used alone or in admixture. In view of improving transparency, alkali solubility, solvent solubility, and avoiding residues occurring in a region outside the pixel, the organic acid is preferably malonic acid, adipic acid, itaconic acid, citraconic acid, 2-furoic acid, fumaric acid, and methyl fumaric acid.

The amount of the organic acid (E) of the present invention can be adjusted depending on the actual requirement. In one embodiment of the invention, the used amount of the organic acid (E) is from 1 to 10 parts by weight; based on 100 parts by weight of the used amount of the alkali-soluble resin (A); preferably from 1.5 to 9 parts by weight; more preferably from 2 to 8 parts by weight.

If the organic acid (E) is absent, the solubility and developability are poor. However, if using an organic acid with the molecular weight more than 1000, the solubility and developability are also poor.

While not wishing to be limited by theory, it is Applicant's belief that when the concentration of acid increases, the opportunity of the neutralization with the alkali in the developer increases, and the developability increases with a smaller line width. With the increase of the molecular weight, the concentration of acid per unit weight decreases, and the developability decreases.

Preferably, the photosensitive resin composition according to the present invention can contain other additives according to the specific requirements for the physical and/or chemical properties. The additives can be chosen by skilled artisans in the field. Examples of the additives are fillers, polymers other than the alkali-soluble resin (A), UV absorbents, anti-coagulants, surfactants, adhesion improving agents, storage stabilizers, and heat resistance improving agents.

In one preferred embodiment of the invention, the fillers are glass, aluminum fillers; the polymers other than the alkali-soluble resin (A) are polyvinyl alcohol, polyglycol monoether, and polyacrylate fluoride.

The UV absorbents are 2-(3-t-butyl-5-methyl-2-hydroxyphenyl)-5-chlorobenzotriazole, or alkoxybenzophenone; and the anti-coagulants include sodium polyacrylate.

The surfactants can improve the coating of the composition according to the invention. In one embodiment of the invention, the surfactants include a fluorine-based surfactants or silicone-based surfactants.

Specific examples of the fluorine-based surfactants include fluorine-based surfactants formed of compounds respectively having a fluoroalkyl or fluoroalkylene group at least at any of the ends. In one embodiment of the invention, the fluorine-based surfactants include 1,1,2,2-tetrafluorooctyl(1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, hexapropylene glycol di(1,1,2,2,3,3-hexafluoropentyl)ether, sodium perfluorododecylsulfonate, 1,1,2,2,8,8,9,9,10,10-decafluorododecane, 1,1,2,2,3,3-hexafluorodecane, sodium fluoroalkylbenzene sulfonate, sodium fluoroalkyl phosphate, sodium fluoroalkyl carboxylate, fluoroalkyl polyoxyethylene ether, diglycerin tetra(fluoroalkyl polyoxyethylene ethers), fluoroalkyl ammonium iodide, fluoroalkyl betaine, fluoroalkyl polyoxyethylene ethers, perfluoroalkyl polyoxyethylene ether, and perfluoroalkyl alkanol. In one another embodiment of the invention, the fluorine-based surfactants include BM-1000, BM-1100 (manufactured by BM CHEMIE), Megafac® F142D, F172, F173, F183, F178, F191, F471 and F476 (manufactured by Dainippon Ink and Chemical Industries, Ltd.), Fluorad® FC-170C, FC-171, FC-430, FC-431 (manufactured by Sumitomo chemical), chlorofluorocarbons S-112, S-113, S-131, S-141, S-145, S-382, SC-101, SC-102, SC-103, SC-104, SC-105, SC-106 (manufactured by Asahi Glass Company), F TOP EF301, 303, 352 (manufactured by Shin Akita Chemical Co., Ltd), FTERGENT FT-100, FT-110, FT-140A, FT-150, FT-250, FT-251, FTX-251, FTX-218, FT-300, FT-310, FT-400S (manufactured by NEOSU Ltd.)

Examples of the silicone-based surfactants are TORE silicone DC3PA DC7PA, SH11PA, SH21PA, SH28PA, SH29PA, SH3OPA, SH-190, SH-193, SZ-6032, SF-8427, SF-8428, DC-57, DC-190 (manufactured by Dow Corning Toray Silicone), TSF-4440, TSF-4300, TSF-4445, TSF-4446, TSF-4460, TSF-4452 (manufactured by GE Toshiba silicone).

In addition to said fluorine-based surfactants or silicone-based surfactants, the surfactant refers to polyoxyethylene alkyl ethers, such as lauryl alcohol polyoxyethylene, polyoxyethylene stearic acid ether and polyoxyethylene oleyl ether; polyoxyethylene aryl ethers, such as polyoxyethylene n-octyl phenyl ether and polyoxyethylene n-nonylphenol ether; polyoxyethylene dialkyl esters, such as polyoxyethylene dilaurate and polyoxyethylene distearate; non-ionic surfactants, such as KP341 (manufactured by Shin-Etsu Chemical), poly Flow No. 57, 95 (manufactured by Kyoeisha Yushi Chemical Industries, Ltd.)

The aforesaid examples of surfactants can be used alone or in admixture of two or more thereof.

The adhesion improving agents are able to improve the adhesive force of the substrate, and preferably the adhesion improving agents are functional silane crosslinking agents. Preferably, the functional silane crosslinking agents include a carboxyl, alkenyl, isocyanate, epoxy group, amino, sulfhydryl group or halogen. Examples are as follows: p-hydroxyphenyltrimethoxy silane, 3-methacroxyl propyl trimethoxysilane, vinyl triacetoxylsilane, vinyl trimethoxysilane, vinyl triethoxysilane, vinyl tri(2-methoxyethoxy)silane, γ-isocyanate propyl triethoxysilane, 3-epoxy propoxy propyl trimethoxysilane, 2-(3,4-epoxy cyclohexane) ethyl trimethoxysilane, 3-epoxy propoxy dimethyl methoxysilane, 3-aminopropyl trimethoxysilane, N-(2-aminoethyl)-3-aminopropyl trimethoxysilane, N-(2-aminoethyl)-3-aminopropyl methyl dimethoxysilane, 3-mercaptopropyl trimethoxysilane, 3-chloropropyl trimethoxysilane and 3-chloropropyl methyl dimethoxysilane. In another aspect, commercialized products are Z 6030 (manufactured by Dow Corning Toray Silicone), KBE-903, KBE-603, KBE-403, and KBM-403

(manufactured by Shin-Etsu Chemical). Those adhesion improving agents can be used independently or mixedly.

The storage stabilizers can be sulphur, quinone, hydroquinone, poly oxide, amine, nitroso compounds or Nitro compounds. Examples are as follows: 4-methoxyphenol, (N-mitroso-N-phenyl) hydroxylamino aluminum, 2,2-thiobis(4-methyl-6-tert-butylphenol) and 2,6-di-tert-butylphenol.

The heat resistance improving agents can be to N-(alkoxy methyl)glycoluril compounds and N-(alkoxy methyl) melamine Examples of said N-(alkoxy methyl)glycoluril compounds are as follows: N,N,N',N'-tetra(methoxy methyl) glycoluril, N,N,N',N'-tetra(ethyoxyl methyl)glycoluril, N,N,N',N'-tetra(n-propoxy methyl)glycoluril, N,N,N',N'-tetra (isopropoxy methyl)glycoluril, N,N,N',N'-tetra(n-butoxy methyl)glycoluril and N,N,N',N'-tetra(tert-butoxy methyl)glycoluril, and preferably N,N,N',N'-tetra(methoxy methyl) glycoluril. Examples of said N-(alkoxy methyl) melamine are as follows: N,N,N',N',N'',N''-hexa(methoxy methyl) melamine, N,N,N',N',N'',N''-hexa(ethyoxyl methyl) melamine, N,N,N',N',N'',N''-hexa(n-propoxy methyl) melamine, N,N,N',N',N'',N''-hexa(isopropoxy methyl) melamine, N,N,N',N',N'',N''-hexa(n-butoxy methyl) melamine, and N,N,N',N',N'',N''-hexa(tert-butoxy methyl) melamine, and preferably N,N,N',N',N'',N''-hexa(methoxy methyl) melamine. Commercialized products are such as NIKARAKKU N-2702 and MW-30M (manufacutred by SANHE CHEMICALS CO. LTD).

The amount of the additives according to the invention can be chosen by skilled artisans in this field. Preferably, The additives are used in an amount ranging generally from 0 to 10 parts by weight, preferably from 0 to 6 parts by weight, and more preferably from 0 to 3 parts by weight, based on 100 parts by weight of the alkali-soluble resin (A).

The present invention also provides a method for forming a thin film on a substrate comprising applying the photosensitive resin composition as mentioned above on the substrate; preferably, the thin film is an overcoat or a spacer.

The present invention also provides a thin film on a substrate, which is obtained by the method as mentioned above.

In one embodiment of the invention, the method for forming the overcoat comprises at least steps of:
 (a) applying the photosensitive composition according to the invention on a substrate to form a film;
 (b) irradiating at least one part of the film with radiation;
 (c) developing the film after radiating with radiation; and
 (d) heating the film after development.

The steps are illustrated as follows:

Step (a) is applying the photosensitive composition according to the invention on a substrate to form a film. When forming an overcoat, a pixel layer consisting of red, green and blue colored layers is formed on a transparent substrate, and then the photosensitive resin composition according to the present invention is formed on said pixel layer. When forming a spacer, a transparent conductive film is covered on a transparent substrate having an overcoat and pixel layer, and then a film of said photosensitive resin composition is formed on the transparent conductive film.

In one embodiment of the present invention, said transparent substrate refers to glass or resin substrate, and preferably glass substrate such as soda-lime glass and alkali-free glass. Examples of said resin substrate are as follows: plyethylene terephthalate, polybutylene terephthalate, polyether sulfone, polycarbonate and polyimide.

One embodiment of the transparent conductive film contains NESA film (USA PPG®) having stannic oxide ($SnO_2$) or ITO film having indium oxide-stannic oxide ($In_2O_3$—$SnO_2$), etc on the entire surface.

The manner for forming the film can be coating method or drying film method.

According to the coating method for forming film, the solution of the photosensitive resin composition according to the present invention is coated on said transparent conductive film. Preferably, the coating surface of the film is heated up (pre-baked). The composition solution used in the coating method has a solid content concentration preferably 5 to 50 wt %, more preferably 10 to 40 wt %, and most preferably 15 to 35 wt %. The coating methods include (but not limited to) spraying, roller painting, spin coating, slit die coating, stick coating, inkjet coating, and preferably spin coating or slit die coating method.

On the other hand, the drying film method is conducted in a way that the photosensitive dry film of the photosensitive resin composition according to the present invention (referred to as "photosensitive dry film") is stacked on a base film.

Said photosensitive dry film can be stacked on a dry film to form a photosensitive film after removing solvent. The photosensitive resin composition applied in the drying film method has a solid content concentration preferably about 5 to 50 wt %, more preferably 10 to 50 wt % and 20 to 50 wt %, most preferably 30 to 50 wt %. Examples of the base film of the photosensitive dry film are as follows: polyethylene terephthalate (PET), polyethylene, polypropylene, polycarbonate and polyvinyl chloride. The thickness of the base film of the photosensitive dry film is preferably 15 to 125 μm and more preferably 1 to 30 μm.

When not in use, the photosensitive dry film can also be stacked and stored by a coating film. The coating film according to the present invention preferably has de-bonding property to make it not to be separated when not in use and make it easy to be separated when in use. Examples of the coating film having said property are organic silicon release agent sprayed or printed onto a synthetic resin film, such as PET film, polypropylene film, polyethylene film, polyvinyl chloride film and polyurethane film. The thickness of such coating film is preferably about 5 to 30 μm. Such coating film can also be stacked into 2 to 3 layers.

One embodiment of stacking the film by drying film method is conducted in a way of hot-pressing and bonding the transparent photosensitive dry film on a transparent base film.

In the aforesaid method, the film is preferably processed by the coating method, and then by drying film method, and preferably by pre-baking. The pre-baking conditions may differ according to the composition and mixing ratio, preferably heating at 70 to 120° C. for 1 to 15 minutes.

The thickness of film after pre-baking is preferably 0.5 to 10 μm, more preferably 1.0 to 7.0 μm.

Step (b) is irradiating at least one part of the film with radiation. When conducting the irradiation, a photomask with a predetermined pattern can be used.

Examples of the radiation for exposure are visible light, ultraviolet light or far-infrared light; wherein the wavelength of radiation is preferably within the range of 250 to 550 nm (including ultraviolet light), more preferably including 365 nm.

Radiation dose (exposure amount) is measuring the radiation intensity at a wavelength of 365 nm by the luxmeter (OAI Model 356, Optical Associates Inc.), and preferably is 100 to 5,000 $J/m^2$, more preferably 200 to 3,000 $J/m^2$.

Step (c) is developing the film after radiating with radiation for removing the unwanted parts and forming a predetermined pattern.

Examples of the developing solution are inorganic base, such as: sodium hydroxide, potassium hydroxide, sodium carbonate, sodium silicate, sodium metasilicate and ammonia; primary aliphatic amine, such as ethylamine and N-propylamine; secondary aliphatic amine, such as diethylamine and N-propylamine; tertiary aliphatic amine, such as trimethylamine, diethylmethyl amine, dimethyl ethyl amine and triethylamine; tertiary alicyclic acid, such as pyrrole, piperidine, N-nethylpiperidine, N-methylmorpholine 1,8-diazabicyclo[5.4.0]-7-undecene, 1,5-diazabicyclo[4.3.0]-5-nonene; tertiary aromatic amine, such as pyridine, methylpyrimidine, lutidine and quinoline; quartus ammonium salt alkaline compound, such as tetramethyl ammonium hydroxide and aqueous solution of tetraethyl ammonium hydroxide; water-soluble organic solvent and/or surfactant such as methanol and ethanol, which can be added into aforesaid alkali compounds as needed.

The developing methods like dipping, impregnation or showering methods are preferably conducted at room temperature to 180° C. for 10 seconds.

After development, the desired pattern is cleaned for 30 to 90 seconds via vapor, and dried up via compressed air or nitrogen.

Step (d) is heating the film after development. The obtained film with the desired pattern is heated up to 100 to 250° C. for 30 to 180 minutes (after-baking) via an appropriate heater like a heating plate or oven.

The aforementioned spacer or overcoat with a desired pattern has excellent properties, such as: compressive strength, abrasive resistance of liquid crystal display alignment film and adhesive force of the substrate.

The present invention further provides a liquid crystal display component comprising the thin film as mentioned above.

The photosensitive resin composition according to the present invention preferably forma a spacer and an overcoat at least on one side (preferably both sides) in the liquid crystal display component according to the present invention.

The liquid crystal display component according to the present invention can be manufactured by the following two methods.

(1) An overcoat or spacer is formed with the photosensitive resin composition according to the invention on one or both sides of a primary (electrode) transparent substrate having a transparent conductive film on at least one side as mentioned above. Then, an alignment film with liquid crystal alignment is formed on the transparent conductive film having the spacer and/or overcoat. On those base materials, the surface where the alignment film formed is taken as the inner surface, such that liquid crystal orientations of the various alignment films are arranged anti-parallelly or vertically and reversely configured by a certain gap (intercellular space). The liquid crystals are filled into the intercellular space defined by the surface of the base materials (alignment film), and the filling hole is sealed to form a liquid crystal unit. Therefore, the liquid crystal display component with same alignment on the inner and outer surfaces can be formed by the inner and outer liquid crystal units that formed by bonding a vertical polarizer or the liquid crystal polarization arranged on a substrate surface.

(2) An overcoat or spacer is formed with the photosensitive resin composition according to the invention on one or both sides of a primary (electrode) transparent substrate having a transparent conductive film on at least one side as mentioned above. Then, the adhesive hardened by UV-light is coated along the endpoint of the substrate, and the tiny liquid crystals are dropped onto the substrate via a liquid crystal distributor. Next, those substrates is stacked under the vacuum condition and sealed under irradiation of high-pressure mercury lamp which can transmit UV-light. Finally, the liquid crystal display component is formed by bonding the polarizers inside and outside the liquid crystals.

Examples of the liquid crystal display component according to the present invention are of nematic or smectic liquid crystals, preferably nematic liquid crystals such as Shiff's base type liquid crystal, azoxy liquid crystal, biphenyl liquid crystal, phenylcyclohexane liquid crystal, ester liquid crystal, terphenyl liquid crystal, biphenyl cyclohexane liquid crystal, pyrimidine liquid crystal, dioxane polycycloolefinoctane liquid crystal, bicyclooctane liquid crystal, pentacyclo octane liquid crystal, the chloride liquid crystal, cholesteric liquid crystal such as cholesterol carbonate or bile steroidal liquid crystal, and a ferroelectric liquid crystal added with a chiral agent such as p-decyloxy-benzylidene-p-amino-2-methylbutyl cinnamate (C-15, CB-15, Merck Ltd.).

A Polarizer, alignment extension of polyvinyl alcohol, "H film" for absorbing iodine or H film clamped between a cellulose acetate overcoat and a polarizer can be used on the outer side of the liquid crystals.

The following examples are given for the purpose of illustration only and are not intended to limit the scope of the present invention.

EXAMPLE

Preparation of Resin Having an Unsaturated Group (A-1-1)

The feed composition comprises 100 parts by weight of a fluorene compound containing an epoxy group (ESF-300, manufactured by NIPPON STEEL CHEMICAL Co., Ltd.), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate. The feeding composition was continuously added into a 500-mL four-necked flask with a feeding rate of 25 parts by weight/minute. The reaction temperature was 100° C. to 110° C., the reaction time was 15 hours to obtain a pale yellow transparent mixture with a solid content of 50 wt %.

Then, 100 parts by weight of the pale yellow transparent mixture was dissolved in 25 parts by weight of ethylene glycol monoethyl ether acetate, and added with 6 parts by weight of tetrahydrophthalic anhydride and 13 parts by weight of benzophenone tetracarboxylic dianhydride. The reactants were heated to 110° C. to 115° C. for 2 hours to obtain a resin having an unsaturated group (hereandafter as A-1-1) with an acid value of 98.0 mgKOH/g.

Preparation of Resin Having an Unsaturated Group (A-1-2)

The feed composition comprises 100 parts by weight of a fluorene compound containing an epoxy group (ESF-300, manufactured by NIPPON STEEL CHEMICAL Co., Ltd.), 30 parts by weight of acrylic acid, 0.3 parts by weight of benzyltriethylammonium chloride, 0.1 parts by weight of 2,6-di-t-butyl-p-cresol, and 130 parts by weight of propylene glycol methyl ether acetate. The feeding composition was continuously added into a 500-mL four-necked flask with a feeding rate of 25 parts by weight/minute. The reaction temperature was 100° C. to 110° C., the reaction time was 15 hours to obtain a pale yellow transparent mixture with a solid content of 50 wt %.

Then, 100 parts by weight of the pale yellow transparent mixture was dissolved in 25 parts by weight of ethylene glycol monoethyl ether acetate, and added with 13 parts by weight of benzophenone tetracarboxylic dianhydride. The reactants were heated to 90° C. to 95° C. for 2 hours and added with 6 parts by weight of tetrahydrophthalic anhydride. The reactants were heated to 90° C. to 95° C. for 4 hours to obtain a resin having an unsaturated group (hereandafter as A-1-2) with an acid value of 99.0 mgKOH/g.

Preparation of Resin Having an Unsaturated Group (A-1-3)

The feed composition comprises 400 parts by weight of an epoxy compound (NC-3000, manufactured by NIPPON KAYAKU Co., Ltd.), 102 parts by weight of acrylic acid, 0.3 parts by weight of methoxyphenol, 5 parts by weight of triphenyl phosphine, and 264 parts by weight of propylene glycol methyl ether acetate. The reaction temperature was 95° C., the reaction time was 9 hours to obtain an intermediate with an acid value of 2.2 mgKOH/g. Then, 151 parts by weight of tetrahydrophthalic anhydride was added and heated to 95° C. for 4 hours to obtain a resin having an unsaturated group (hereandafter as A-1-3) with an acid value of 102.0 mgKOH/g and weight average molecular weight of 3200.

The other alkali-soluble Resin (A-2) is prepared according to the formulation in Table 1.

Preparation of Other Alkali-soluble Resin (A-2-1)

A 1000 ml four-necked flask equipped with a nitrogen inlet, a stirrer, a heater, a condenser and a thermometer was added with the feed composition according to the ratio shown in Table 1 with nitrogen introduced. The feed composition comprises 30 parts by weight of methyl methacrylate monomer (hereinafter referred to as MAA), 35 parts by weight of glycidyl methacrylate monomer (hereinafter referred to as GMA), 10 parts by weight of 1,3-butadiene, 25 parts by weight of styrene, 2.4 parts by weight of 2,2'-azobis-2-methylbutyronitrile, and 240 parts by weight of diethylene glycol dimethyl ether. The reactants were slowly stirred and the reaction temperature was heated to 85° C. in the polymerization process, and the polymerization time was 5.0 hours. After the completion of the polymerization, the polymerization product was taken out from the four-necked flask and the solvent was devolatilized to obtain the other alkali-soluble resin A-2-1.

Preparations of Other Alkali-soluble Resins (A-2-1) to (A-2-5)

Preparations of other alkali-soluble resins (A-2-1) to (A-2-5) were conducted in a manner identical to that of the preparation of other alkali-soluble resin (A-2-1) with different reaction conditions as well as altered ingredients and amounts which are illustrated in Table 1.

TABLE 1

| Preparation | Composition Monomer (mol) | | | | | | | | | | |
|---|---|---|---|---|---|---|---|---|---|---|---|
| | MAA | HOMS | MA | GMA | EC-MMA | HEMA | TBMA | FA-513M | BzMA | SM | BD |
| A-2-1 | 5 | | | 35 | | 25 | | | | 25 | 10 |
| A-2-2 | | 10 | | 50 | 20 | | | 10 | | 10 | |
| A-2-3 | 20 | | | 20 | 10 | | | 10 | 10 | 30 | |
| A-2-4 | 30 | | 5 | 20 | | | | | 20 | 25 | |
| A-2-5 | 20 | 30 | | 10 | | | 15 | | | 25 | |

| Preparation | Composition | | | | Temp. (° C.) | Time (hour) |
|---|---|---|---|---|---|---|
| | Solvent (g) | | photoinitiator (g) | | | |
| | Diglyme | PGMEA | AMBN | ADVN | | |
| A-2-1 | 240 | | 2.4 | | 85 | 5 |
| A-2-2 | | 240 | | 2.4 | 80 | 6 |
| A-2-3 | 200 | 40 | 3.0 | | 85 | 5 |
| A-2-4 | 300 | | 3.0 | | 85 | 5 |
| A-2-5 | | 300 | | 3.0 | 85 | 6 |

AMBN 2,2'-azobis-2-methyl butyronitrile
ADVN 2,2'-azobis(2,4-dimethylvaleronitrile)
MAA methacrylic acid
HOMS 2-methacryloyloxyethyl succinate monoester
MA maleic anhydride
GMA glycidyl methacylate
EC-MAA 3,4-Epoxycyclohexylmethyl methacrylate
HEMA 2-hydroxyethyl methacrylate
TBMA t-butyl methacrylate
FA-513M dicyclopentanyl methacrylate
BzMA benzyl methacrylate
SM styrene monomer
BD 1,3-butadiene
Diglyme diethylene glycol dimethyl ether
PGMEA Propylene glycol ethyl ether acetate Preparation of Organic Acid (E-4):

A 1000 ml four-necked flask equipped with a nitrogen inlet, a stirrer, a heater, a condenser and a thermometer was added with the feed composition. The feed composition comprises 5 parts by weight of methacrylic acid, 95 parts by weight of methyl methacrylate, 6 parts by weight of 2,2'-azobis-2-methylbutyronitrile, and 240 parts by weight of diethylene glycol dimethyl ether. The reactants were slowly stirred and the reaction temperature was heated to 60° C. in the polymerization process, and the polymerization time was 2.0 hours. After the completion of the polymerization, the polymerization product was taken out from the four-necked flask and the solvent was devolatilized to obtain the organic acid with a weight average molecular weight of 2000.

Preparation of Photosensitive Resin Composition:

The photosensitive resin composition is prepared according to the formulation in Table 2.

Example 1

100 parts by weight of the alkali-soluble resin (A-1); 30 parts by weight of the compound having an ethylenically unsaturated group (B–1); 10 parts by weight of the photoinitiator (C-1-1) and 1 part by weight of the organic acid (E–1) were mixed and dissolved in 200 parts by weight of the solvent (D–1) using a shaker to obtain Example 1 of the blue photosensitive resin composition.

Examples 2 to 9 and Comparative Examples 1 to 4

Examples 2 to 9 and Comparative Examples 1 to 4 of photosensitive resin composition were prepared with the same procedure as in Example 1 except: changing the kind and the amount used of the raw materials, the kind and the amount used of the raw materials was shown in Tables 2 and 3.

Overcoat or Spacer Formation

The photosensitive resin composition was spin-coated on a glass substrate (100×100×0.7 mm) to form a film having a thickness of 6.0 μm. The film was pre-baked at 90° C. for 2 to 3 min. The pre-baked film was positioned between the designed pattern of the mask and exposed by UV (100 mJ/cm², AG500-4N; manufactured by M&R Nano Technology). The exposed film was immersed in 0.05% of KOH solution for 45 seconds to remove the un-exposed portions. The film was then washed with water and post-baked at 235° C. for 30 min to obtain the overcoat or spacer on the substrate.

Assays
(1) Resolution:

The examples and the comparative examples of the photosensitive resin composition were coated on a glass substrate using a rotation coating method. Pre-bake was implemented at a temperature of 100° C. for 3 minutes, thereby forming a pre-baked coating film of 1 μm film thickness. The aforementioned coating film was positioned between a line and space mask (NIPPON FILCON CO., LTD) and radiated with UV ray of 50 mJ/cm² (AG500-4N; manufactured by M&R Nano Technology) and immersed in the developer of 0.84% potassium hydroxide at 23° C. for 1 minute to remove the un-exposed portions. Then, the film was washed with deionized water. The resolution is designed as the minimum of the width of the line formed.

⊚: minimum of the width of the line ≤ 10 μm
○: 10 μm < minimum of the width of the line ≤ 15 μm
Δ: 15 μm < minimum of the width of the line ≤ 20 μm
X: 20 μm < minimum of the width of the line (2) Developability:

The pre-baked film was positioned between the designed pattern of the mask and exposed by UV (100 mJ/cm², Canon PLA-501F). The exposed film was immersed in developer at 23° C. for 1 minute to remove the un-exposed portions. The film was then washed with water and post-baked at 235° C. for 30 min to obtain a photosensitive resin pattern on the substrate. The pattern was observed under the microscope to observe if residues occurring at the un-exposure portions.

○: no residues
Δ: few residues
X: lots of residues

TABLE 2

| Component | | | Example 1 | 2 | 3 | 4 | 5 | 6 | 7 | 8 | 9 |
|---|---|---|---|---|---|---|---|---|---|---|---|
| alkali-soluble resin (A) (parts by weight) | A-1 | A-1-1 | 100 | | | 50 | 30 | 50 | 70 | 30 | 50 |
| | | A-1-2 | | 100 | | 50 | | | | | |
| | | A-1-3 | | | 100 | | | | | | |
| | A-2 | A-2-1 | | | | | 70 | | | | |
| | | A-2-2 | | | | | | 50 | | | 20 |
| | | A-2-3 | | | | | | | 30 | | |
| | | A-2-4 | | | | | | | | 70 | |
| | | A-2-5 | | | | | | | | | 30 |
| compound having an ethylenically unsaturated group (B) (parts by weight) | B-1 | | 30 | | 50 | 100 | | 200 | | | 200 |
| | B-2 | | | 70 | 50 | | 150 | | 300 | 150 | |
| photoinitiator (C) (parts by weight) | C-1 | C-1-1 | 10 | | | | | 35 | | | 35 |
| | | C-1-2 | | 25 | | | | | | | |
| | | C-1-3 | | | 50 | | | | 30 | | |
| | C-2 | C-2-1 | | | | 60 | 50 | | | 50 | |
| | | C-2-2 | | | | | | | 35 | 30 | 35 |
| | C-3 | C-3-1 | | | | | 20 | | | 20 | |
| | | C-3-2 | | | | | | | 20 | | |
| solvent (D) (parts by weight) | D-1 | | 200 | | 700 | 400 | 800 | | 800 | 800 | |
| | D-2 | | | 500 | | 300 | | 1000 | 400 | | 1000 |
| organic acid (E) (parts by weight) | E-1 | | 1 | | | 3 | | 8 | 10 | | 8 |
| | E-2 | | | 3 | | | 6 | | | 6 | |
| | E-3 | | | | 5 | 3 | | | | | |
| | E-4 | | | | | | | | | | |
| additives (F) (parts by weight) | F-1 | | | 0.1 | | | | | | | |
| | F-2 | | | | | | | | 0.1 | | |
| Assays | resolution | | ○ | ○ | ○ | ⊚ | ⊚ | ⊚ | ⊚ | ⊚ | ⊚ |
| | developability | | ○ | ○ | ○ | ○ | ○ | ○ | ○ | ○ | ○ |

TABLE 3

| component | | | Comparative Example 1 | 2 | 3 | 4 |
|---|---|---|---|---|---|---|
| alkali-soluble resin (A) (parts by weight) | A-1 | A-1-1 | | | 100 | 50 |
| | | A-1-2 | | | | |
| | | A-1-3 | | | | |

TABLE 3-continued

| component | | | Comparative Example | | | |
|---|---|---|---|---|---|---|
| | | | 1 | 2 | 3 | 4 |
| | A-2 | A-2-1 | 100 | | | |
| | | A-2-2 | | | 50 | |
| | | A-2-3 | | | | 100 |
| | | A-2-4 | | | | |
| | | A-2-5 | | | | |
| compound having an ethylenically unsaturated group (B) (parts by weight) | B-1 | | 50 | 100 | 200 | |
| | B-2 | | 50 | | | 300 |
| photoinitiator (C) (parts by weight) | C-1 | C-1-1 | | 60 | 35 | |
| | | C-1-2 | | | | |
| | | C-1-3 | 50 | | | 30 |
| | C-2 | C-2-1 | | | | |
| | | C-2-2 | | | 35 | |
| | C-3 | C-3-1 | | | | |
| | | C-3-2 | | | | 50 |
| solvent (D) (parts by weight) | D-1 | | 700 | 400 | | 800 |
| | D-2 | | | 300 | 1000 | 400 |
| organic acid (E) (parts by weight) | E-1 | | | | | |
| | E-2 | | | | | |
| | E-3 | | 5 | | | |
| | E-4 | | | | 5 | |
| additives (F) (parts by weight) | F-1 | | | | | |
| | F-2 | | | | | |
| Assays | | Resolution | X | X | X | X |
| | | Developability | Δ | X | X | X |

In Table 2 and Table 3:

| B-1 | dipentaerythritol hexaacrylate | |
|---|---|---|
| B-2 | dipentaerythritol tetraacrylate | |
| C-1-1 | 1-[9-ethyl-6-(2-methylbenzoyl)-9H-carbazole-3-yl]-ethanone 1-(O-acetyloxime) | (OXE-02; manufacturedCiba Specialty ChemicalsCo.) |
| C-1-2 | 1-[4-(phenylthio)phenyl]-octane-1,2-dione 2-(O-benzoyloxime) (for example, the trade name OXE01) | (OXE-01; manufactured by CIBA SPECIALTY CHEMICALS Corporation) |
| C-1-3 | ethanone-1-[9-ethyl-6-(2-methyl-4-tetrahydrofuranylmethoxybenzoyl)-9H-carbazole-3-yl]-1-(O-acetyloxime) | |
| C-2-1 | 2-benzyl-2-N,N-dimethylamino-1-(4-morpholinophenyl)-1-butanone | (IRGACURE 369; manufactured by CIBA SPECIALTY CHEMICALS Corporation) |
| C-2-2 | 2-methyl-1-(4-methylthiophenyl)-2-morpholino-1-propanone | (IRGACURE 907; manufactured by CIBA SPECIALTY CHEMICALS Corporation) |
| C-3-1 | 4,4'-bis (dimethylamino)benzophenone | |
| C-3-2 | 4,4'-bis(diethylamine)benzo-phenone | |
| D-1 | propylene glycol methyl ether acetate | |
| D-2 | ethyl 3-ethoxy propionate | |
| E-1 | 2-Furoic acid | |
| E-2 | Citraconic acid | |
| E-3 | Cyclohexanecarboxylic acid | |
| E-4 | Organic acid with high molecular weight (Mw: 2000) | |
| F-1 | SF-8427 | Toray Dow Corning Silicon |
| F-2 | KBM403 | Shin-Etsu Chemical Co., Ltd. |

While embodiments of the present invention have been illustrated and described, various modifications and improvements can be made by persons skilled in the art. It is intended that the present invention is not limited to the particular forms as illustrated, and that all modifications not departing from the spirit and scope of the present invention are within the scope as defined in the following claims.

What is claimed is:

1. A photosensitive resin composition comprising:

an alkali-soluble resin (A);

wherein the alkali-soluble resin (A) comprises a resin having an unsaturated group (A-1) synthesized by reacting a mixture, and the mixture comprises an epoxy compound having at least two epoxy groups (i) and a compound having at least one carboxyl group and at least one vinyl unsaturated group (ii);

wherein the alkali-soluble resin (A) further comprises an other alkali-soluble resin (A-2), and the other alkali-soluble resin (A-2) is polymerized with an unsaturated carboxylic acid or unsaturated carboxylic acid anhydride compound (a1), an unsaturated compound containing an epoxy group (a2), and an other unsaturated compound (a3), wherein the unsaturated compound containing an epoxy group (a2) is at least one selected from the group consisting of (meth)acrylate compound containing an epoxy group, α-alkyl acrylate compound containing an epoxy group, and epoxypropyl ether;

wherein the used amount of the other alkali-soluble resin (A-2) is from 30 to 70 parts by weight based on 100 parts by weight of the used amount of the alkali-soluble resin (A);

a compound having an ethylenically unsaturated group (B);

a photoinitiator (C);

a solvent (D); and an organic acid (E);

wherein a molecular weight of said organic acid (E) is below 1000.

2. The photosensitive resin composition according to claim 1, wherein the epoxy compound having at least two epoxy groups (i) is represented by Formula (1) or (2),

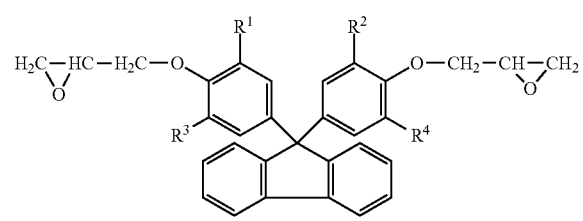

Formula (1)

wherein:

$R^1$ to $R^4$ independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms;

Formula (2)

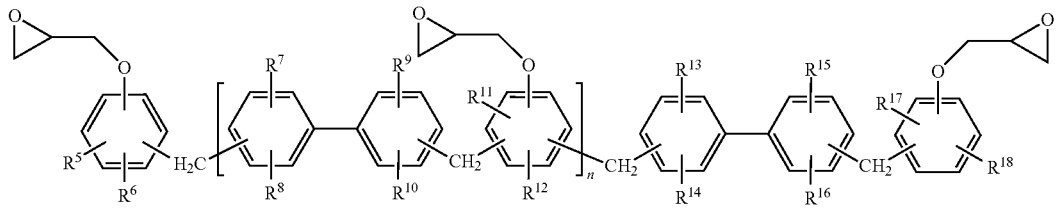

wherein:

R⁵ to R¹⁸ independently represents a hydrogen atom, a halogen atom, an alkyl group with one to eight carbon atoms or an aromatic group with six to fifteen carbon atoms; and n represents an integer of zero to ten.

wherein:

R¹ to R⁴ independently represents a hydrogen atom, a halogen atom, an alkyl group with one to five carbon atoms, an alkoxy group with one to five carbon atoms, an aryl group with six to twelve carbon atoms or an aromatic alkyl group with six to twelve carbon atoms;

Formula (2)

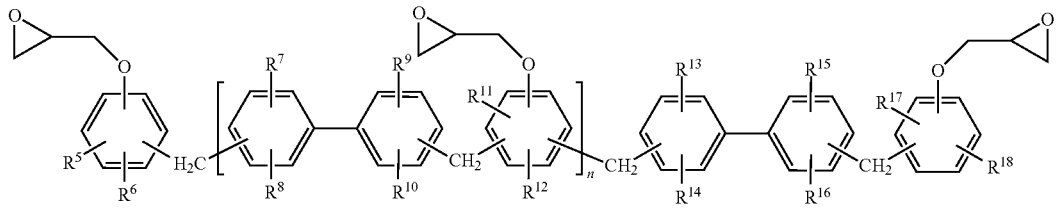

wherein:

R⁵ to R¹⁸ independently represents a hydrogen atom, a halogen atom, an alkyl group with one to eight carbon atoms or an aromatic group with six to fifteen carbon atoms; and n represents an integer of zero to ten.

3. The photosensitive resin composition according to claim 1, wherein the organic acid (E) is at least one selected from the group consisting of an aliphatic carboxylic acid, alicyclic carboxylic acid, and aromatic carboxylic acid.

4. The photosensitive resin composition according to claim 1, wherein the used amount of the resin having an unsaturated group (A-1) is from 30 to 100 parts by weight; the used amount of the compound having an ethylenically unsaturated group (B) is from 30 to 300 parts by weight; the used amount of the photoinitiator (C) is from 10 to 80 parts by weight; the used amount of the solvent (D) is from 200 to 1200 parts by weight; the used amount of the organic acid (E) is from 1 to 10 parts by weight; based on 100 parts by weight of the used amount of the alkali-soluble resin (A).

5. A method for forming a thin film on a substrate comprising applying the photosensitive resin composition according to claim 1 on the substrate.

6. The method according to claim 5, wherein the epoxy compound having at least two epoxy groups (i) is represented by Formula (1) or (2), 7. The method according to claim 5, wherein the organic acid (E) is at least one selected from the group consisting of an aliphatic carboxylic acid, alicyclic carboxylic acid, and aromatic carboxylic acid.

8. The method according to claim 5, wherein the used amount of the resin having an unsaturated group (A-1) is from 30 to 100 parts by weight; the used amount of the compound having an ethylenically unsaturated group (B) is from 30 to 300 parts by weight; the used amount of the photoinitiator (C) is from 10 to 80 parts by weight; the used amount of the solvent (D) is from 200 to 1200 parts by weight; the used amount of the organic acid (E) is from 1 to 10 parts by weight; based on 100 parts by weight of the used amount of the alkali-soluble resin (A).

9. A thin film on a substrate, which is obtained by the method according to claim 5.

10. The thin film on the substrate according to claim 9, which is an overcoat or a spacer for a liquid crystal display component.

11. A liquid crystal display component comprising the thin film on the substrate according to claim 9.

12. A liquid crystal display component comprising the thin film on the substrate according to claim 10.

Formula (1)

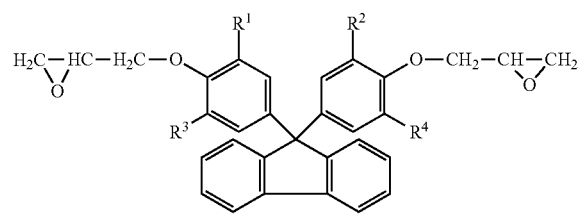

* * * * *